US012165918B2

(12) United States Patent
Mukherjee et al.

(10) Patent No.: US 12,165,918 B2
(45) Date of Patent: *Dec. 10, 2024

(54) CONFORMAL TITANIUM NITRIDE-BASED THIN FILMS AND METHODS OF FORMING SAME

(71) Applicant: Eugenus, Inc., San Jose, CA (US)

(72) Inventors: Niloy Mukherjee, San Ramon, CA (US); Hae Young Kim, San Jose, CA (US); Jerry Mack, San Jose, CA (US); Jae Seok Heo, Dublin, CA (US); Sung-Hoon Jung, Santa Clara, CA (US); Somilkumar J. Rathi, San Jose, CA (US); Srishti Chugh, San Jose, CA (US); Nariman Naghibolashrafi, San Jose, CA (US); Yoshikazu Okuyama, Santa Cruz, CA (US); Bunsen B. Nie, Fremont, CA (US)

(73) Assignee: Eugenus, Inc., San Jose, CA (US)

( * ) Notice: Subject to any disclaimer, the term of this patent is extended or adjusted under 35 U.S.C. 154(b) by 15 days.

This patent is subject to a terminal disclaimer.

(21) Appl. No.: 17/837,518

(22) Filed: Jun. 10, 2022

(65) Prior Publication Data

US 2022/0415709 A1 Dec. 29, 2022

Related U.S. Application Data

(63) Continuation of application No. 16/595,916, filed on Oct. 8, 2019, now Pat. No. 11,361,992.

(51) Int. Cl.
*H01L 21/768* (2006.01)
(52) U.S. Cl.
CPC .. *H01L 21/76843* (2013.01); *H01L 21/76861* (2013.01); *H01L 21/76877* (2013.01)

(58) Field of Classification Search
CPC ......... H01L 21/76843; H01L 21/76877; H01L 21/76846; H01L 21/76861; H01L 21/2855
See application file for complete search history.

(56) References Cited

U.S. PATENT DOCUMENTS 6,482,733 B2 * 11/2002 Raaijmakers ..... H01L 21/32051
257/E21.171
6,831,003 B1 * 12/2004 Huang .............. H01L 21/76844
438/653

(Continued)

FOREIGN PATENT DOCUMENTS

TW  201445001  12/2014
WO  WO 2008/151104 A1  12/2008

OTHER PUBLICATIONS

International Search Report and Written Opinion dated Jan. 5, 2021 in Application No. PCT/US2020/050639.

(Continued)

*Primary Examiner* — Jaehwan Oh
*Assistant Examiner* — John M Parker
(74) *Attorney, Agent, or Firm* — Knobbe Martens Olson & Bear, LLP

(57) ABSTRACT

The disclosed technology generally relates to forming a titanium nitride-based thin films, and more particularly to a conformal and smooth titanium nitride-based thin films and methods of forming the same. In one aspect, a method of forming a thin film comprising one or both of TiSiN or TiAlN comprises exposing a semiconductor substrate to one or more vapor deposition cycles at a pressure in a reaction chamber greater than 1 torr, wherein a plurality of the vapor deposition cycles comprises an exposure to a titanium (Ti) precursor, an exposure to a nitrogen (N) precursor and an exposure to one or both of a silicon (Si) precursor or an aluminum (Al) precursor.

19 Claims, 14 Drawing Sheets

(56) References Cited

U.S. PATENT DOCUMENTS

| | | | |
|---|---|---|---|
| 9,099,473 B2 | 8/2015 | Kim et al. | |
| 9,159,608 B2 | 10/2015 | Park et al. | |
| 11,361,992 B2 | 6/2022 | Mukherjee et al. | |
| 2002/0031911 A1 | 3/2002 | Pyo | |
| 2002/0084529 A1* | 7/2002 | Dubin | H01L 21/288 |
| | | | 257/E21.174 |
| 2002/0155700 A1* | 10/2002 | Chen | H01L 21/76843 |
| | | | 438/653 |
| 2002/0173142 A1* | 11/2002 | Vanhaelemeersch | |
| | | | H01L 23/53238 |
| | | | 257/E21.256 |
| 2005/0124153 A1* | 6/2005 | Cohen | H01L 21/76843 |
| | | | 438/634 |
| 2006/0003557 A1* | 1/2006 | Cabral | H01L 21/28088 |
| | | | 257/E21.171 |
| 2008/0286899 A1* | 11/2008 | Jung | H01L 25/50 |
| | | | 438/107 |
| 2014/0273452 A1 | 9/2014 | Bloomberg et al. | |
| 2015/0050806 A1 | 2/2015 | Park et al. | |
| 2017/0194204 A1* | 7/2017 | Sowa | H01L 21/76846 |
| 2017/0373197 A1* | 12/2017 | Sharangpani | H01L 23/5283 |
| 2018/0158917 A1* | 6/2018 | Odnoblyudov | H01L 29/4175 |
| 2018/0347040 A1 | 12/2018 | Vats et al. | |
| 2018/0350657 A1 | 12/2018 | Vats et al. | |
| 2019/0273145 A1 | 9/2019 | Chiu et al. | |
| 2021/0104433 A1 | 4/2021 | Mukherjee et al. | |

OTHER PUBLICATIONS

International Preliminary Report on Patentability dated Apr. 21, 2022 in Application No. PCT/US2020/050639 in 15 pages.

* cited by examiner

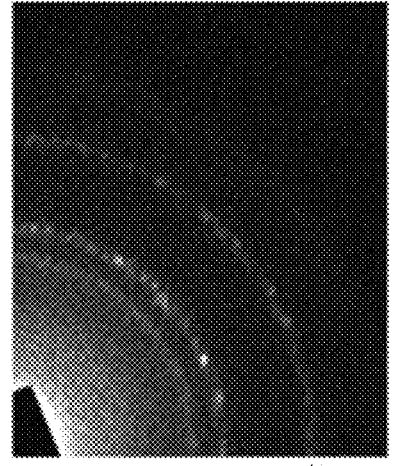
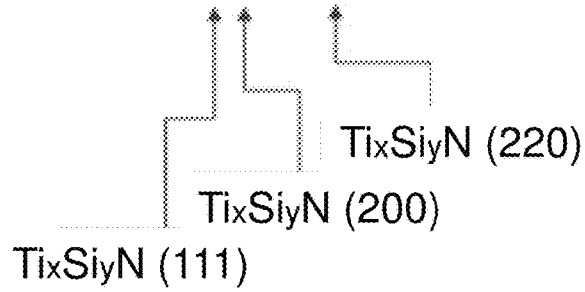
FIG. 7C
FIG. 7B
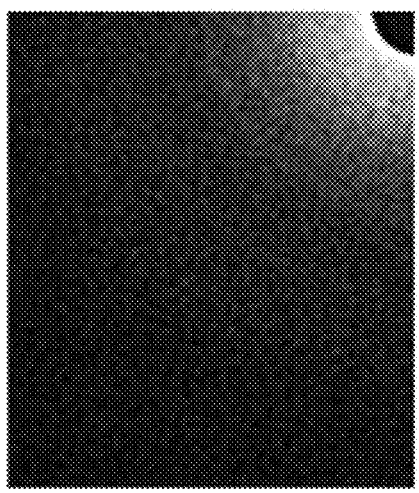
FIG. 7A

CONFORMAL TITANIUM NITRIDE-BASED THIN FILMS AND METHODS OF FORMING SAME

INCORPORATION BY REFERENCE

This application is a continuation of U.S. patent application Ser. No. 16/595,916, now U.S. Pat. No. 11,361,992, filed Oct. 8, 2019, the entire disclosure of which is incorporated herein by reference in its entirety.

BACKGROUND

Field

The disclosed technology generally relates to forming a titanium nitride-based thin films, and more particularly to a conformal and smooth titanium nitride-based thin films.

Description of the Related Art

Thin films based on titanium nitride (TiN) have been widely used in fabrication of various structures in integrated circuits (ICs). For example, TiN has been used in diffusion barriers, various electrodes and metallization structures. Such wide usage of TiN in IC fabrication can be attributed to its structural, thermal and electrical properties. As the dimensions of various IC structures shrink, TiN is formed on features having increasingly smaller dimensions and complex topologies. For example, as the technology node scales to 10 nm node and beyond, there is a need for thin films, e.g., diffusion barriers, that can conformally line high aspect ratio trenches and vias having dimensions as small as few nanometers. While techniques such as physical vapor deposition (PVD) and chemical vapor deposition (CVD) have been used in the IC industry to form TiN diffusion barriers, the increased need for conformality of TiN films to be deposited in smaller trenches or vias may eventually limit their usage. On the other hand, while atomic layer deposition (ALD) has been demonstrated for conformal deposition of TiN films, some electrical properties (e.g., conductivity) and physical properties (e.g., surface roughness) of the film may be inferior compared to TiN films formed using other methods such as physical vapor deposition (PVD). Thus, there is a need for deposition methods for forming TiN-based films with superior properties, including barrier characteristics, surface smoothness and step coverage, relative to TiN films formed by, e.g., PVD and CVD, for use in IC fabrication.

SUMMARY

In one aspect, a method of forming a diffusion barrier comprises forming a thin film comprising one or both of TiSiN or TiAlN on a semiconductor substrate in a reaction chamber. Forming the thin film comprises exposing the semiconductor substrate to a plurality of vapor deposition cycles at a pressure in the reaction chamber greater than 1 Torr, wherein the vapor deposition cycles comprise, at different frequencies from one another, exposures to a titanium (Ti) precursor, exposures to a nitrogen (N) precursor and exposures to one or both of a silicon (Si) precursor or an aluminum (Al) precursor. The semiconductor substrate comprises a surface topography such that a ratio of a surface area of the semiconductor substrate exposed to the one or more vapor deposition cycles to a surface area of a corresponding unpatterned semiconductor substrate exceeds 2.

In another aspect, a method of forming a diffusion barrier comprises providing a semiconductor substrate comprising a plurality trenches or vias formed thereon, wherein the trenches or vias comprise a dielectric sidewall surface and an aspect ratio exceeding 5. The method further comprises lining surfaces of the trenches or vias with a diffusion barrier layer comprising one or both of TiSiN or TiAlN that is at least partially amorphous by exposing the semiconductor substrate to a plurality of vapor deposition cycles, wherein the vapor deposition cycles comprise, a different frequencies, exposures to a titanium (Ti) precursor, exposures to a nitrogen (N) precursor and exposures to one or both of a silicon (Si) precursor or an aluminum (Al) precursor.

In another aspect, a method of forming a thin film comprising one or both of TiSiN or TiAlN comprises exposing a semiconductor substrate to a plurality of vapor deposition cycles at a pressure in a reaction chamber greater than 5 Torr, wherein the vapor deposition cycles comprise, at different frequencies, exposures to a titanium (Ti) precursor, exposures to a nitrogen (N) precursor and exposures to one or both of a silicon (Si) precursor or an aluminum (Al) precursor.

In another aspect, a semiconductor structure comprises a semiconductor substrate comprising a plurality of openings formed thereon, wherein the openings comprise a dielectric sidewall surface and an aspect ratio exceeding 5. The semiconductor structure additionally comprises a diffusion barrier layer comprising one or both of TiSiN or TiAlN conformally lining surfaces of openings, wherein the diffusion barrier layer is at least partially amorphous.

BRIEF DESCRIPTION OF THE DRAWINGS

Embodiments of this disclosure will now be described, by way of non-limiting example, with reference to the accompanying drawings.

FIG. 7A shows a selected area diffraction pattern obtained from a substantially amorphous thin film comprising TiSiN lining a high aspect ratio, according to embodiments.

FIG. 7B shows a selected area diffraction pattern obtained from a partially crystalline thin film comprising TiSiN lining a high aspect ratio, according to embodiments.

FIG. 7C shows a selected area diffraction pattern obtained from a substantially crystalline thin film comprising TiSiN lining a high aspect ratio, according to embodiments.

DETAILED DESCRIPTION

Figure 1:
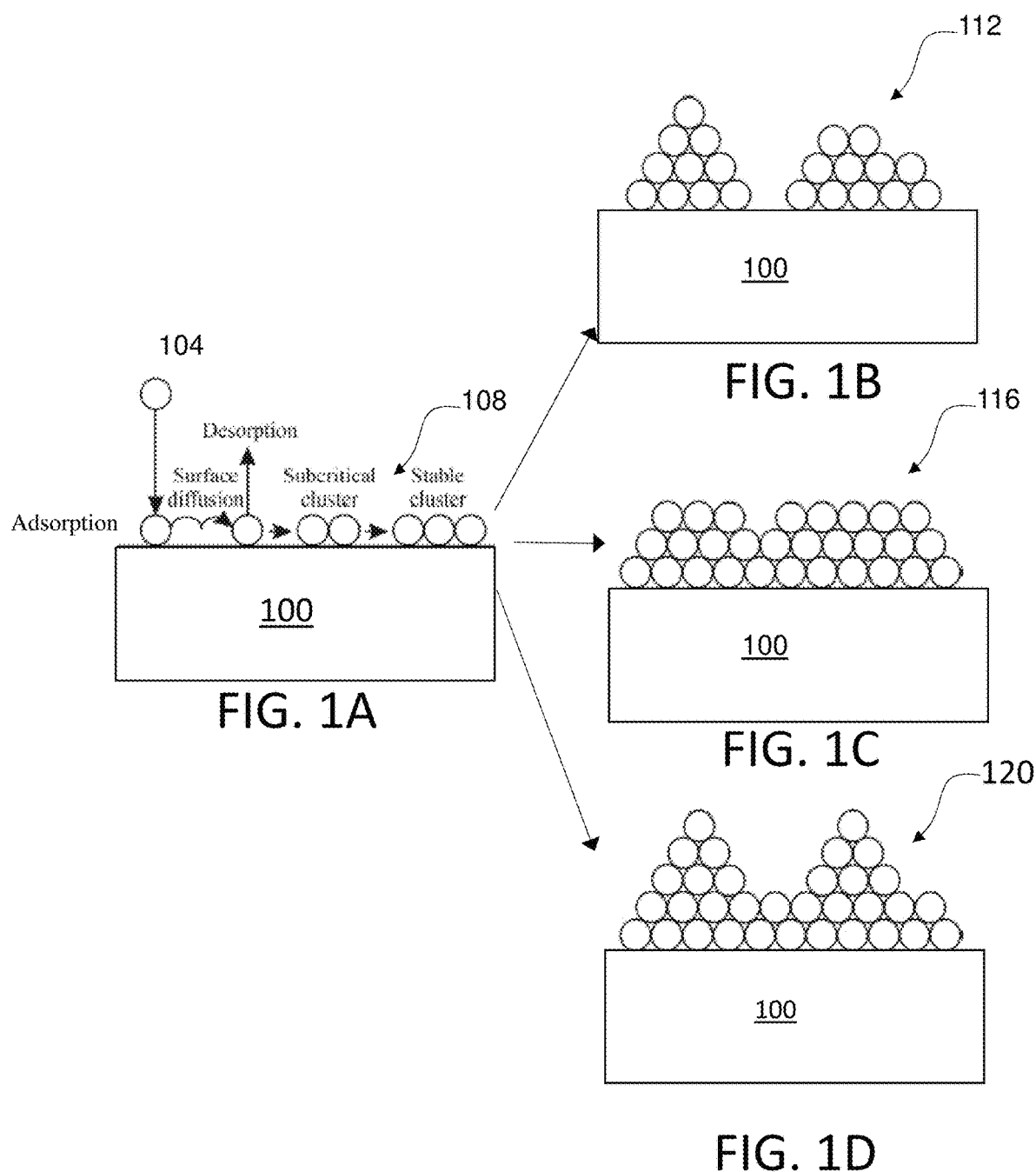
FIGS. 1A-1D schematically illustrate different nucleation and growth mechanisms of thin films under different growth modes.

As described above, there is a need in the integrated circuit (IC) industry for conformal thin films, e.g., TiN-based thin films, with superior physical and barrier properties, as well as methods of forming such films. To address these and other needs, disclosed herein is a thin film comprising TiSiN and/or TiAlN, which can be at least partially amorphous, and a cyclic vapor deposition method, which can be an atomic layer deposition (ALD) method, of forming such thin film, which displays the conformality characteristic of a film deposited by ALD, while also having barrier properties that are superior or matching those of TiN films formed by existing physical vapor deposition (PVD) and chemical vapor deposition (CVD) methods. The thin film comprising TiSiN and/or TiAlN can serve as a conformal diffusion barrier. The thin film is formed by a method adapted for a substrate having a relatively large surface area due to the presence of topography, e.g., openings in a dielectric, such as trenches or vias, which can be high (e.g., >1) aspect ratio vias and trenches, at an area density such that the exposed surface area exceeds a planar substrate surface area by at least a factor of 2. The method comprises exposing a semiconductor substrate to one or more vapor deposition cycles at a relatively high pressure (e.g., >1 Torr), wherein the vapor deposition cycles comprise exposures to a titanium (Ti) precursor, exposures to a nitrogen (N) precursor and exposures to one or both of a silicon (Si) precursor or an aluminum (Al) precursor. The thin film comprising TiSiN and/or TiAlN deposited according to the methods disclosed herein advantageously has excellent diffusion barrier characteristics while having excellent conformality, step height coverage and low surface roughness. These and other characteristics of the thin film can be advantageously tuned by controlling the morphology of the thin film at the nanoscale to have varying degrees of crystallinity and/or homogeneity by tuning the process conditions.

As described herein, a compound referred to by its constituent elements without specific stoichiometric ratios thereof shall be understood to encompass all possible non-zero concentrations of each element unless explicitly limited. For example, titanium nitride (TiN) shall be understood to encompass all possible stoichiometric and nonstoichiometric compositions of titanium nitride that can be expressed by a general formula $Ti_xN$, where x>0, including TiN, $Ti_3N_4$, $Ti_4N_3$, $Ti_6N_5$, $Ti_2N$ and $TiN_2$ as well as other non-stoichiometric compositions of Ti and N. Similarly, silicon nitride (SiN) shall be understood to encompass all possible stoichiometric and nonstoichiometric compositions of silicon nitride that can be expressed by a general formula $Si_yN$, including $Si_3N_4$, where y>0; aluminum nitride (AlN) shall be understood to encompass all possible stoichiometric and nonstoichiometric compositions of aluminum nitride that can be expressed by a general formula $Al_yN$, including AlN, where y>0; titanium silicon nitride (TiSiN) shall be understood to encompass all possible stoichiometric and nonstoichiometric compositions of titanium silicon nitride that can be expressed by a general formula $Ti_xSi_yN$, where x>0 and y>0; titanium aluminum nitride (TiAlN) shall be understood to encompass all possible stoichiometric and nonstoichiometric compositions of titanium aluminum nitride that can be expressed by a general formula $Ti_xAl_yN$, where x>0 and y>0.

As described above, titanium nitride-based thin films play an important role in integrated circuit (IC) fabrication. While techniques such as physical vapor deposition (PVD) and chemical vapor deposition (CVD) have been used in the IC industry to deposit TiN, the need for deposition methods for forming TiN-based films, e.g., ternary or quaternary alloys including Ti, N and one or more additional metals including Si and/or Al, having high conformality without significant compromise in electrical and/or physical properties has been increasing.

In addition, while plasma-enhanced processes such as plasma enhanced atomic layer deposition (PE-ALD) may be effective in forming conformal films on surfaces having relatively low aspect ratios, such processes may not be effective in depositing films inside vias and cavities having relative high aspect ratios. Without being limited by theory, one possible reason for this is that a plasma may not reach deeper portions of high aspect ratio vias under some circumstances. In these circumstances, different portions of the vias may be exposed to different amounts of the plasma, leading to undesirable structural effects arising from non-uniform deposition, such as thicker films being deposited near the opening of the via compared to deeper portions (sometimes called cusping or keyhole formation). For these reasons, a thermal cyclic vapor deposition such as thermal ALD may be more advantageous, because such thermal processes do not depend on the ability of the plasma to reach portions of the surface being deposited on.

However, while thermal ALD techniques may be suitable for forming relatively conformal TiN-based thin films on topography, particularly topography with relatively high aspect ratios (e.g., over 1:1), the inventors have recognized that TiN-based thin films formed by thermal ALD can be inferior to TiN-based thin films formed by PVD or CVD in some respects, e.g., film roughness and electrical resistivity. In this regard, the inventors have discovered that some electrical properties and/or physical properties of ALD-grown TiN-based films can be affected by the mode of growth. In particular, the inventors have discovered that, while it may be desirable to grow the TiN-based films in a two-dimensional layer-by-layer growth mode in ALD, such layer-by-layer growth mode may not be easily achieved under some circumstances. The inventors have further discovered that growing TiN-based thin films by ALD in a layer-by-layer growth mode poses a particular challenge in IC fabrication where the TiN-based films are formed on non-metal surfaces, particularly insulating surfaces such as oxide and nitride surfaces or semiconductor surfaces such as doped and undoped silicon surfaces. The inventors have recognized that the degree to which the TiN-based thin films may be grown in a layer-by-layer growth mode may in turn depend on the initial growth mode that depends on the type of surface and the degree of crystallinity, as described herein without being bound to any theory, in reference to FIGS. 1A-1D.

FIG. 1A schematically illustrates nucleation of a TiN-based layer and FIGS. 1B-1D illustrate different growth modes of the TiN-based layer on different surfaces. Referring FIG. 1A, once precursor molecules 104 reach the surface of a substrate 100, they become physically adsorbed thereon. Some of the adsorbed molecules 104 may diffuse along the surface of the substrate 100 until they reach an energetically favorable position to be chemisorbed. The surface diffusion is governed by, among other things, the substrate temperature, the substrate material and kinetic energy of the adsorbed molecules. When the size of nuclei formed by chemisorbed molecules exceeds a certain size (sometimes referred to as "critical size") determined by the trade-off between volume free energy and surface energy, the nuclei may become energetically stable, and start to grow in size. Thus formed layer 108 of stable nuclei continue to grow by incorporating additional precursor molecules 104. Subsequent film growth can be classified according to different growth modes, as schematically illustrated in FIGS. 1B-1D.

FIG. 1B schematically illustrates a three-dimensional island growth mode, sometimes referred to as Volmer-Weber growth mode, which results in the formation of a layer 112 of three-dimensional islands. Without being bound to any theory, the island growth mode can dominate when the net surface free energy associated with three-dimensional islands is positive, indicating that deposited atoms are more strongly bound to each other than to the substrate. It will be appreciated that the energetics of ALD growth of TiN-based layers can favor the island growth mode, e.g., when metallic TiN-based layers are deposited on some semiconductor and/or insulating material surfaces.

FIG. 1C illustrates a layer-by-layer growth mode, sometimes referred to as Frank-van der Merwe growth mode, which results in the formation of a relatively smooth two-dimensional layer 116. Without being bound to any theory, the layer-by-layer growth mode can dominate when the deposited atoms are more strongly bound to the substrate than to each other, such that a stable two-dimensional layer 116 is energetically favored. The layer-by-layer growth mode can be sustained when there is a continuous decrease in bonding energy between the layers from the first monolayer to the bulk-crystal value of the TiN-based layer.

While FIGS. 1B and 1C are two different possible growth modes of TiN-based thin films, it will be appreciated that, under some circumstances, a growth mode that is intermediate between a layer-by-layer growth mode and a three-dimensional growth mode is possible. FIG. 1D illustrates an example of an intermediate growth mode known as Stranski-Krastanov (SK) growth mode. Without being bound to any theory, the SK growth may occur in thin film growth that commences in a layer-by-layer mode. When layer-by-layer growth becomes unfavorable after the formation of one or more monolayers, an island growth mode starts to dominate over a layer-by-layer growth mode, resulting in thin film structure 120 in which three dimensional islands are formed on a two-dimensional initial layer. The SK growth mode can occur as a strain relaxation mechanism (strain-induced roughening).

In addition to the interaction between the deposited material and the substrate, other factors such as the substrate temperature, pressure and deposition rate can significantly affect the nucleation and early growth processes, which in turn affects the final nanostructure or microstructure of the resulting thin film. For example, deposition at relatively high substrate temperatures and/or low deposition rates may promote the growth of relatively large grains, while relatively low substrate temperatures and high deposition rates may favor the formation of smaller grains.

It has been discovered that, when TiN-based thin film is grown by ALD on various surfaces of interest in IC fabrication, such as dielectric and semiconductor surfaces, the ALD growth may initialize in a three-dimensional island growth mode or a SK growth mode. For example, under some circumstances, ALD growth of TiN-based thin films on substrate surfaces including doped and undoped Si, $SiO_2$, $Si_3N_4$ and other high K or low K materials may proceed in an island growth mode or the SK growth mode. The inventors have discovered that, in part owing to the initial growth mode of either an island or SK growth mode, subsequent growth of the TiN-based layer by ALD often results in a film morphology that is undesirable for various applications of ultrathin conformal diffusion barriers for high aspect ratio structures, as illustrated in FIG. 2.

Figure 2:
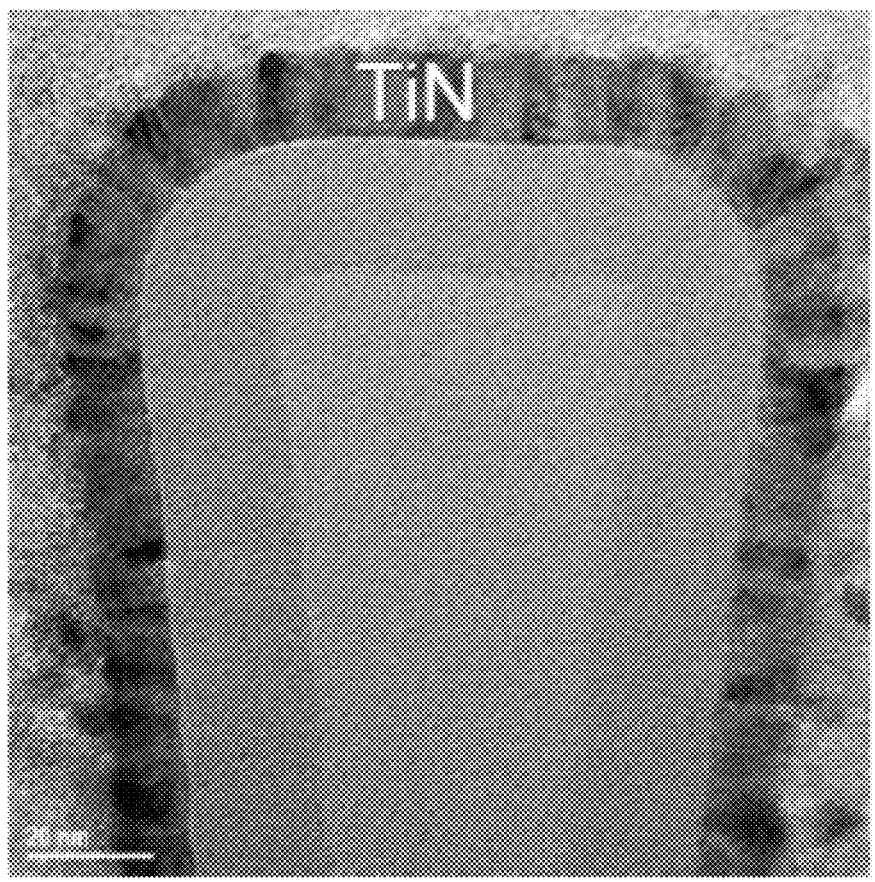
FIG. 2 is a cross-sectional transmission electron micrograph of a TiN layer grown by atomic layer deposition on a silicon substrate having topography.

FIG. 2 is a cross-sectional transmission electron micrograph of a TiN layer grown by thermal ALD on a topography comprising a dielectric ($Si_3N_4$) surface. After an initial film grown in either a three-dimensional island or SK growth mode, the ALD growth of TiN is often characterized by a competitive growth of adjacent crystals with different orientations, resulting, under some circumstances, in V-shaped grains close to the nucleation layer and culminating in a columnar morphology at higher film thicknesses. As illustrated in FIG. 2, the resulting film morphology includes facetted column tops that give rise to a significant surface roughness and column boundaries having lower density relative to the grains. It will be appreciated that the column boundaries can have significantly worse diffusion barrier properties relative to the grains themselves, and may serve as paths of least resistance for transportation of undesirable contaminant through the TiN layer. Furthermore, because of the columnar morphology, relatively thicker TiN layers may need to be deposited to observe sufficient diffusion barrier characteristics. Accordingly, an effective TiN barrier may be too thick for acceptable overall contact or line conductivity, leaving little room for lower resistivity filler materials such as W or Cu.

The inventors have discovered that, when a thin film comprising TiSiN and/or TiAlN, which can be at least partially amorphous, is formed on a non-metal surface, e.g., by thermal cyclic vapor deposition processes such as thermal ALD, the three-dimensional or SK growth mode can be substantially suppressed and a layer-by-layer growth mode can be promoted. Among other reasons, this may be because, when the TiN-based thin film has Si or Al added as an alloying element, and/or has an amorphous phase present therein, the nuclei may wet the non-metal surface with relatively low contact angles. The resulting thin film covers relatively large areas of a non-metal surface with reduced island formation, e.g., because the growth of the thin film tends to proceed more favorably in a layer-by-layer growth mode on substrate surfaces on which TiN-based thin films would normally favor a three-dimensional island or SK growth mode in ALD, as described above. Thus, unlike a TiN layer grown by ALD directly on some non-metal surfaces, which tends to favor a columnar growth as described above, thin films comprising at least partially amorphous TiSiN and/or TiAlN formed on the non-metal surfaces according to embodiments tend to favor a layer-by-layer growth mode, which results in higher conformality and surface smoothness. Furthermore, the presence of the amorphous phase reduces grain boundaries, thereby suppressing fast-diffusing paths for some elements, e.g., Cu or W. The presence of an amorphous phase, higher conformality and/or surface smoothness can in turn enable a reduction in thickness of the diffusion barrier. When formed to line high aspect ratio vias or trenches, the smaller thickness can in turn allow for relatively larger opening for subsequent filling of the vias or trenches with a metal to form a contact via, and/or for reduction in contact resistance.

Figure 3:
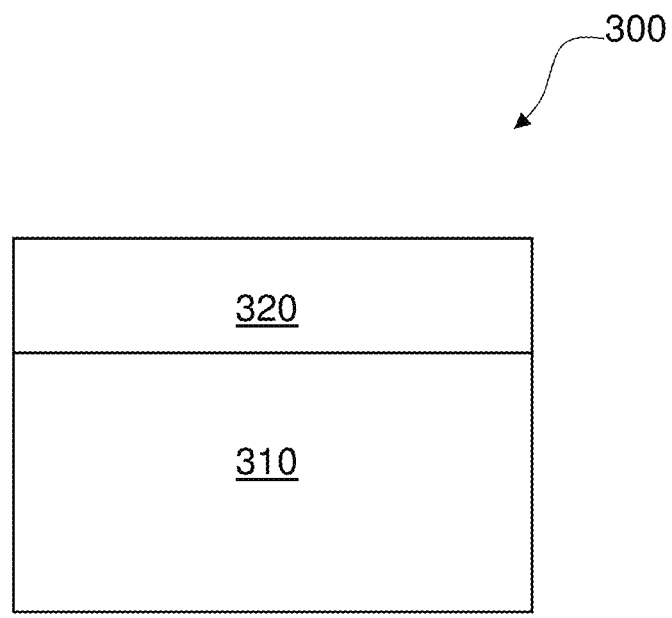
FIG. 3 schematically illustrates a cross-sectional view of a semiconductor structure comprising a thin film comprising TiSiN or TiAlN formed on a semiconductor substrate, according to embodiments.

FIG. 3 schematically illustrates a cross-sectional view of a semiconductor structure 300 comprising a thin film 320 comprising TiSiN and/or TiAlN that may be formed using methods according to various embodiments disclosed herein. The semiconductor thin film structure 300 comprises a substrate 310, e.g., a semiconductor substrate. The substrate 310 may comprise a non-metal surface, e.g., a dielectric and/or a semiconductor surface, on which a thin film 320 comprising at least partially amorphous TiSiN and/or TiAlN is formed according to methods described herein. The thin film 320 has excellent diffusion barrier characteristics while having excellent conformality, step coverage and low surface roughness. These and other characteristics of the thin film can be by advantageously tuned by controlling the crystallinity and/or homogeneity of the thin film at the nanoscale, which can in turn be tuned by tuning various process conditions described herein.

While the thin film comprising TiSiN and/or TiAlN has been illustrated in FIG. 3 as being formed on a planar substrate for clarity, embodiments are not so limited. The benefits of the thin film comprising TiSiN and/or TiAlN can be particularly high when formed on a substrate having topography, e.g., a substrate having high (e.g., >1) aspect ratio vias and trenches and/or having a relatively high density of features, such that the surface area exposed to precursors during cyclic vapor deposition, e.g., ALD, is relatively large (e.g., a surface area exceeding a planar substrate surface area by a factor of 2).

Figure 4:
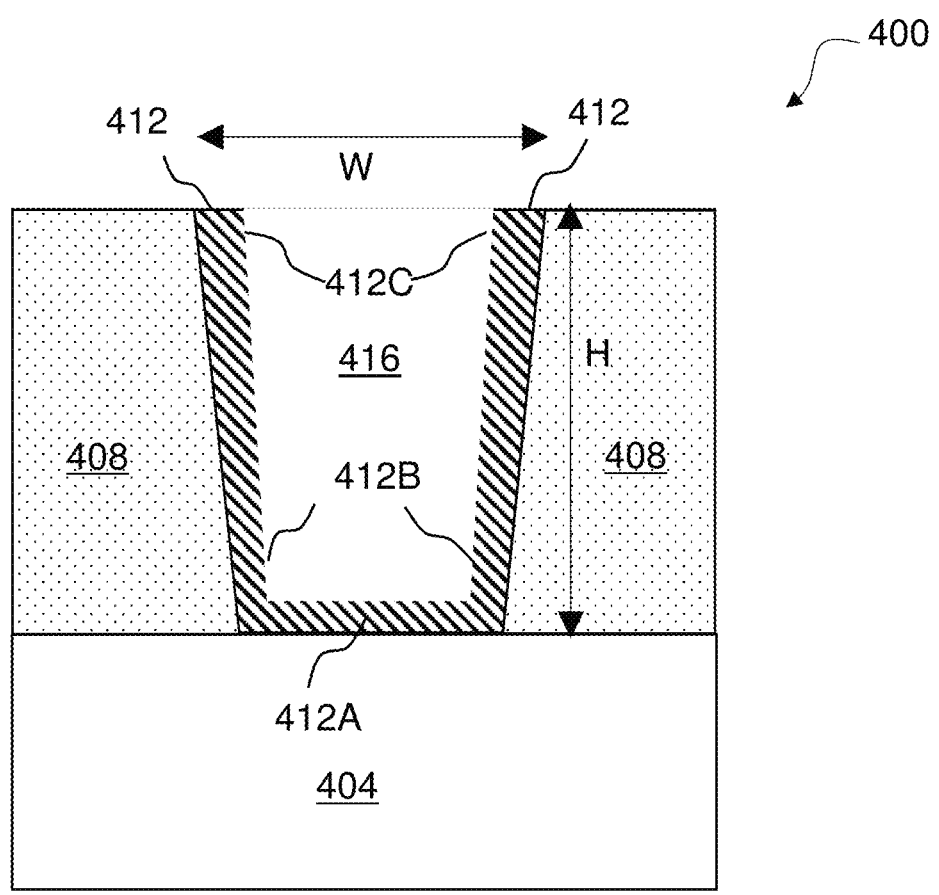
FIG. 4 schematically illustrates a cross-sectional view of a via lined with a thin film comprising TiSiN or TiAlN having different thicknesses at different portions of the via.

One measure of conformality in the context of high aspect ratio structures is referred to herein and in the industry as step coverage. A high aspect ratio structure may be, e.g., a via, a hole, a trench, a hole, a cavity or a similar structure. By way of illustrative example, FIG. 4 schematically illustrates a semiconductor structure 400 having an example high aspect ratio structure 416 formed therein, to illustrate some example metrics of defining and/or measuring conformality of thin films formed on high aspect ratio structures. The illustrated high aspect ratio structure 416 has inner surfaces that are lined with a thin film 412, e.g., a thin film comprising TiSiN and/or TiAlN having different thicknesses at different portions thereof. As described herein, a high aspect ratio structure has an aspect ratio, e.g., a ratio defined as a depth or height (H) divided by a width (W) at the opening region of the high aspect ratio structure 416, which exceeds 1. In the illustrated example, the high aspect ratio structure 416 is a via formed through a dielectric layer 408, e.g., an interlayer dielectric (ILD) layer, formed on a semiconductor material 404. In the illustrated example, a bottom surface of the high aspect ratio structure 416 exposes the underlying semiconductor substrate 404. The thin film 412 can coat different surfaces of the high aspect ratio structure 416 with different thicknesses. As described herein, a step coverage may be defined as a ratio between a thickness of a thin film at a lower or bottom region of a high aspect ratio structure and a thickness of the thin film at an upper or top region of the high aspect ratio structure. The upper or top region may be a region of the high aspect ratio structure at a relatively small depth at, e.g., 0-10% or 0-25% of the H measured from the top of the opening. The lower or bottom region may be a region of the high aspect ratio structure at a relatively large depth at, e.g., 90-100% or 75-100% of the H measured from the top of the opening. In some high aspect ratio structures, a step coverage may be defined or measured by a ratio of thicknesses of the thin film 412A formed at a bottom surface to the thickness of the thin film 412C formed at upper or top sidewall surfaces of the high aspect ratio structure. However, it will be appreciated that some high aspect ratio structures may not have a well-defined bottom surface or a bottom surface having small radius of curvature. In these structures, a step coverage may be more consistently defined or measured by a ratio of thickness of the thin film 412B formed at a lower or bottom sidewall surface to the thickness of the thin film 412C formed at an upper or top sidewall surfaces of the high aspect ratio structure.

Cyclic Vapor Deposition of Thin Films Comprising TiSiN and/or TiAlN

Figure 5A:
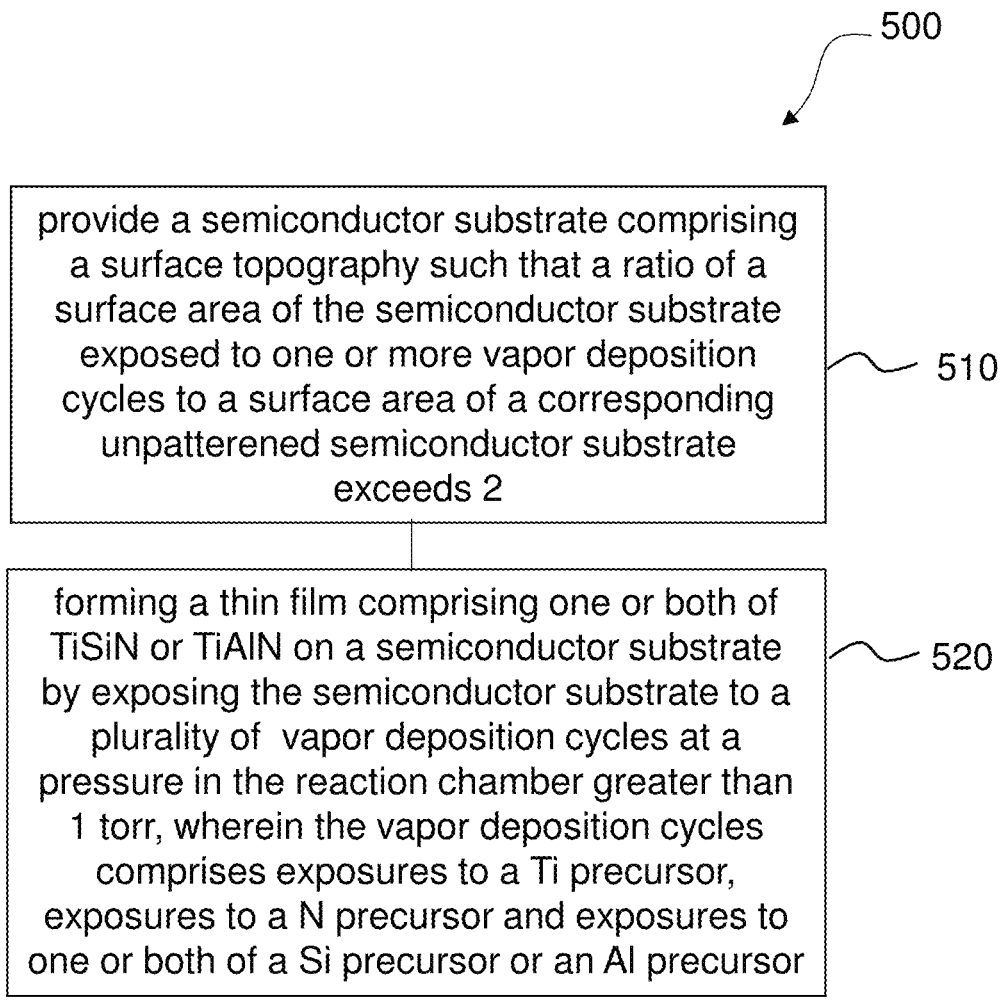
FIG. 5A is a flow chart illustrating a method of forming a thin film comprising TiSiN or TiAlN, according to embodiments.

FIG. 5A illustrates a flow chart of a method 500 of forming a thin film comprising TiSiN and/or TiAlN, according embodiments. The method 500 includes providing 510 a substrate. The substrate can be a planar semiconductor substrate or semiconductor substrate comprising a surface topography such that a ratio of a surface area of the semiconductor substrate exposed to one or more vapor deposition cycles to a surface area of an unpatterned semiconductor substrate exceeds 2, as described herein. The surface topography giving rise to the relatively large surface area may be a plurality openings, such as trenches or vias, formed on the substrate, as described herein. The openings may comprise a dielectric sidewall surface and an aspect ratio exceeding 5.

The method 500 additionally includes forming 520 a thin film, which can serve as a diffusion barrier, comprising titanium silicon nitride (TiSiN) or titanium aluminum nitride (TiAlN). The thin film is formed by exposing the semiconductor substrate to a plurality of vapor deposition cycles at a pressure in the reaction chamber greater than 1 Torr, wherein the vapor deposition cycles comprise exposures to a titanium (Ti) precursor, exposures to a nitrogen (N) precursor and exposures to one or both of a silicon (Si) precursor or an aluminum (Al) precursor.

As described herein and throughout the specification, it will be appreciated that the semiconductor substrate over which the thin film, e.g., a diffusion barrier, comprising TiSiN and/or TiAlN is formed can be implemented in a variety of substrates, including, but not limited to, a doped semiconductor substrate, which can be formed of an elemental Group IV material (e.g., Si, Ge, C or Sn) or an alloy formed of Group IV materials (e.g., SiGe, SiGeC, SiC, SiSn, SiSnC, GeSn, etc.); Group III-V compound semiconductor materials (e.g., GaAs, GaN, InAs, etc.) or an alloy formed of Group III-V materials; Group II-VI semiconductor materials (CdSe, CdS, ZnSe, etc.) or an alloy formed of Group II-VI materials.

According to certain embodiments, the substrate can also be implemented as a semiconductor on insulator, such as silicon on insulator (SOI) substrate. An SOI substrate typically includes a silicon-insulator-silicon structure in which the various structures described above are isolated from a support substrate using an insulator layer such as a buried $SiO_2$ layer (BOX). In addition, it will be appreciated that the various structures described herein can be at least partially formed in an epitaxial layer formed at or near a surface region.

Still referring to FIG. 5A, it will be understood that the method 500 may be carried out over a substrate having been processed through the front-end-of-line, and can include various devices, for instance transistors. Furthermore, the semiconductor substrate can include one or more of a variety of structures pre-formed thereon, e.g., diffusion regions, isolation regions, electrodes, and metallization structures such as contacts and metallization lines, to name a few, over which the method 500 may be performed. The diffusion barrier comprising TiSiN and/or TiAlN may thus be formed on a variety of topographical structures, including vias, cavities, holes or trenches. The surfaces on which the diffusion barrier comprising TiSiN and/or TiAlN according to embodiments can be formed include a metallic surface, e.g., a surface of a metallization structure; a semiconductor surface, e.g., a doped or undoped Si surface; and/or a dielectric surface, e.g., an interlayer dielectric (ILD) surface, a mask or a hard mask surface or a gate dielectric surface, to name a few.

In some embodiments, when formed as a diffusion barrier, a thin film comprising TiSiN and/or TiAlN may be interposed between a dielectric layer, e.g., an interlayer dielectric (e.g., 408 in FIG. 4) and a metallization structure formed by filling a via or a trench (e.g., 416 in FIG. 4) and/or between a semiconductor substrate 404 and the metallization structure formed by filling the via or the trench, thereby serving as a diffusion barrier therebetween, among other functionalities, such as an electrical contact. In these embodiments, the dielectric material may be any dielectric material used in integrated circuit fabrication, e.g., silicon oxide, silicon nitride, high K dielectric or low K dielectric, to name a few. The metallization structure can include a metallization line, a contact structure or other conductive structures formed of a metal or a metallic material for electrically connecting the underlying semiconductor material 404, e.g. a diffusion region, to other parts of an integrated circuit device being fabricated. The metallization structure may be formed of any suitable metal or metallic material including, for example, metals including Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; and conductive metal oxides including $RuO_2$, to name a few.

Still referring to FIG. 5A, the method 500 of forming a thin film, e.g., a diffusion barrier, further comprises forming 520 a thin film comprising TiSiN and/or TiAlN by exposing a semiconductor substrate in a reactor chamber to a plurality of vapor deposition cycles, which can be atomic layer deposition (ALD) cycles, wherein the vapor deposition cycles comprise one or more exposures to a titanium (Ti) precursor, one or more exposures to a nitrogen (N) precursor and one or more exposures to a silicon (Si) precursor or an aluminum (Al) precursor. At least one of the vapor deposition cycles can be performed in a reaction chamber at a pressure greater than about 1 Torr.

As described herein and throughout the specification, a reactor chamber refers to any reaction chamber including a single wafer processing reaction chamber or a batch wafer processing reaction chamber that is suitably configured for cyclic vapor deposition, which can be atomic layer deposition (ALD), e.g., thermal cyclic vapor deposition or ALD. In a thermal cyclic deposition reactor or an ALD reactor, the substrate may be placed on a suitable substrate such as a susceptor or a carrier boat. The substrate may be directly heated by conduction through a heated susceptor, or indirectly heated by radiation from a radiation source such as a lamp or by convection through a heated chamber wall.

Generally in a cyclic vapor deposition or ALD process, reactants or precursors, e.g., oxidizing and reducing reactants, are alternatingly introduced into a reaction chamber having disposed therein a substrate. The introduction of one or more reactants or precursors may be in turn be alternated with a purge and/or a pump out process for removing excess reactants or precursors from the reaction chamber. The reactants may be introduced into the reaction chamber under a condition over a suitable period of time such that the surface on which the diffusion barrier is to be deposited is exposed to the reactants, whereby the surface of the substrate can become at least partly saturated with the precursors or reactants and/or a reaction product of the reactants. Excess or residual precursors or reactants may then be purged and/or pumped out of the reaction chamber. A pump out process may be performed by a suitable vacuum pumping process and a purge step may be performed by introducing a non-reactive or an inert gas, e.g., nitrogen or a noble gas, into the reaction chamber. Other techniques also exist for keeping mutually reactive reactants from mixing in the gas phase.

Figure 5B:
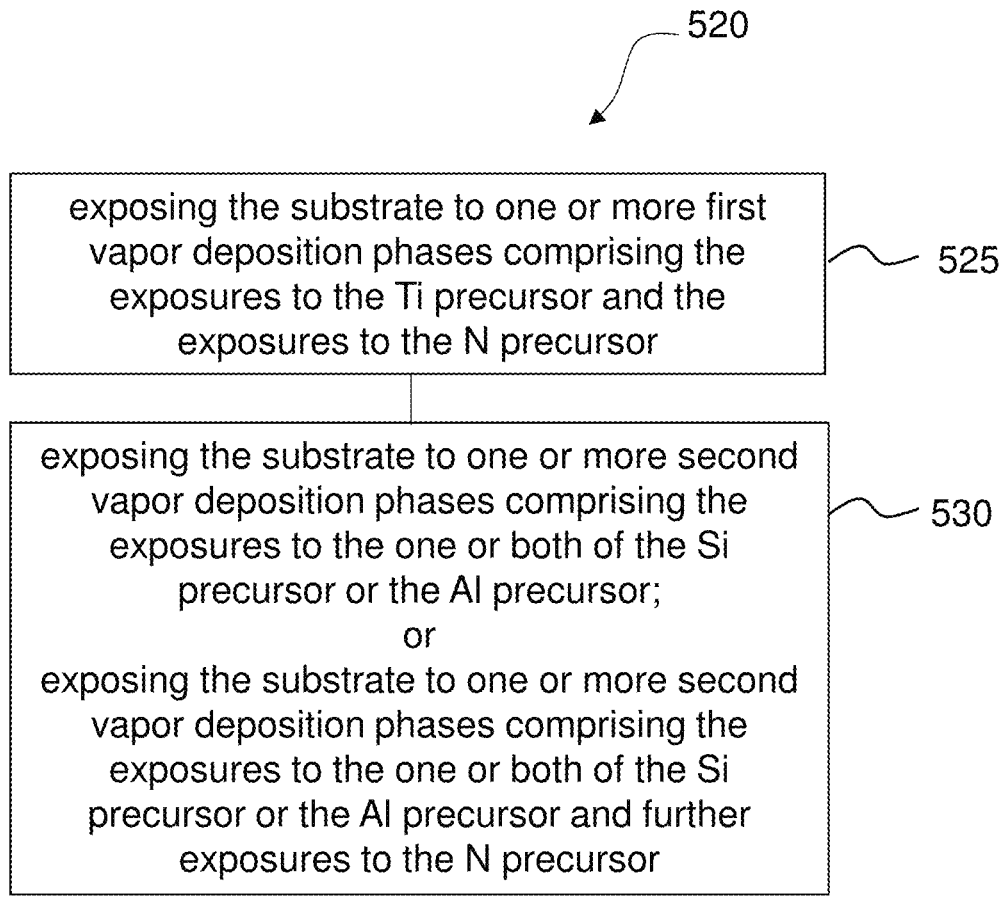
FIG. 5B is a flow chart illustrating a deposition cycle for forming a thin film comprising TiSiN or TiAlN, according to embodiments.
Figure 5C:
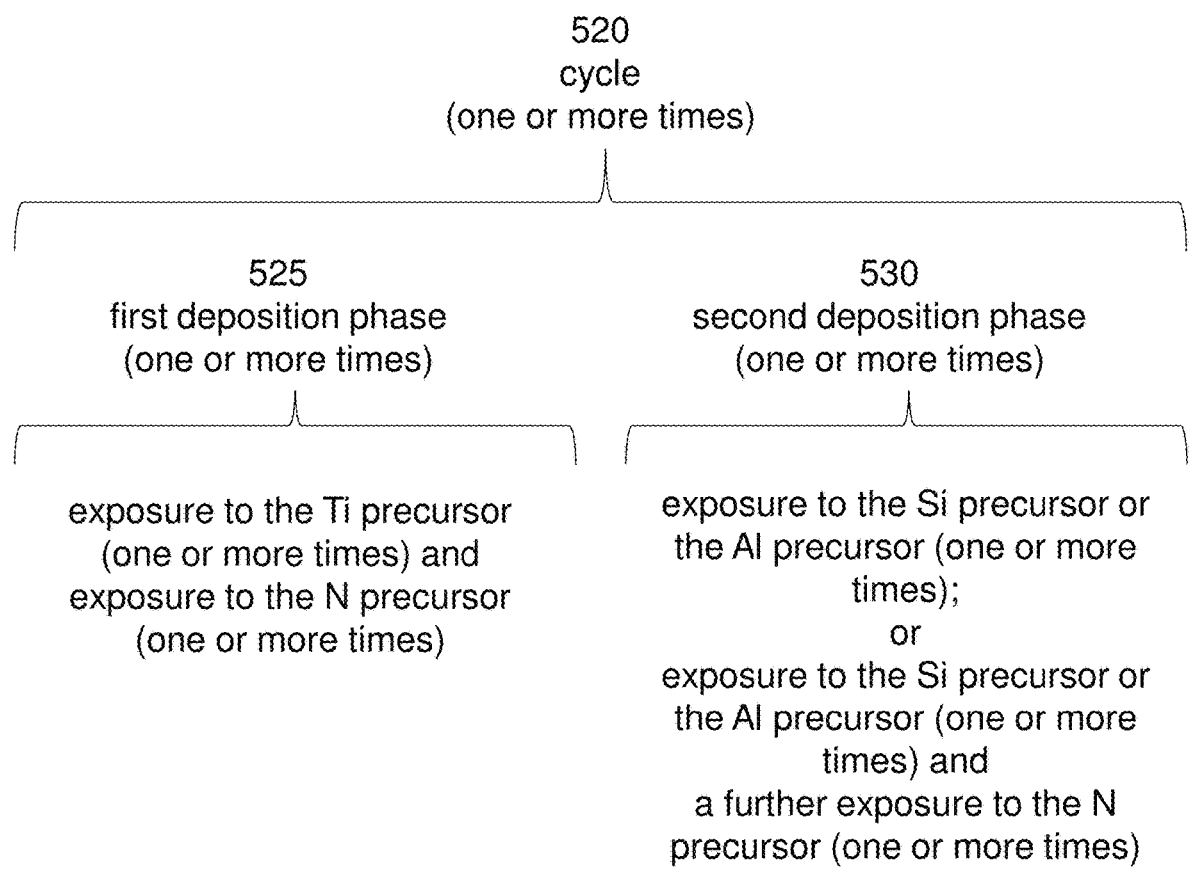
FIG. 5C is a diagram illustrating a deposition cycle for forming a thin film comprising TiSiN or TiAlN, according to embodiments.
Figure 5D:
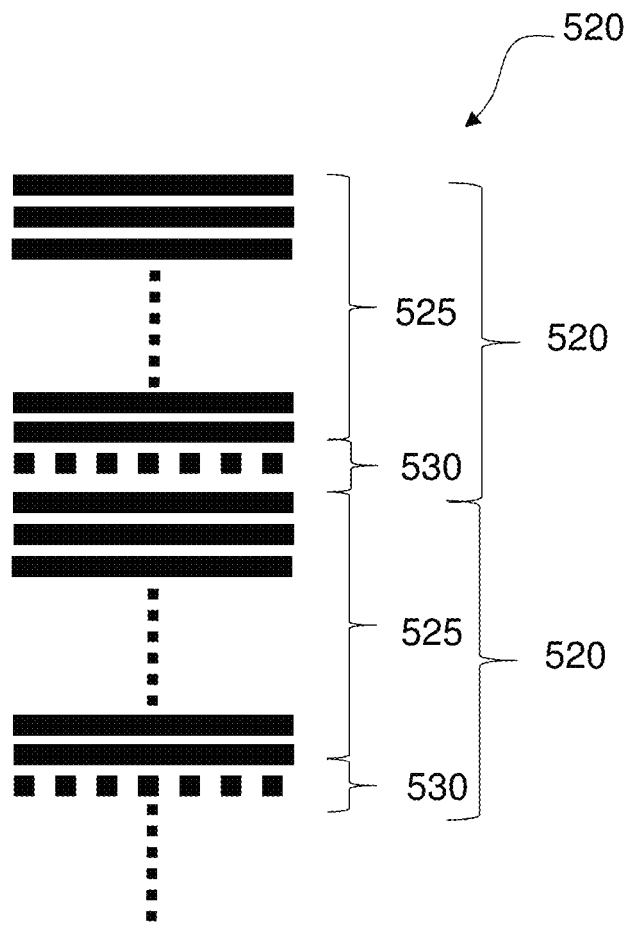
FIG. 5D is a diagram illustrating a sequence of deposition cycles for forming a thin film comprising TiSiN or TiAlN, according to embodiments.

FIG. 5B is a flow chart and FIGS. 5C and 5D are diagrams illustrating a method of forming a diffusion barrier comprising TiSiN and/or TiAlN, according to embodiments. FIG. 5C illustrates deposition phases comprising exposures to precursors, and a cycle comprising exposures to deposition phases. FIG. 5D illustrates a sequence of cyclic deposition phases as part of multiple cycles. Referring to FIGS. 5B-5D, according to various embodiments, exposing 520 (FIG. 5A) the semiconductor substrate to one or more vapor deposition cycles, which can be ALD cycles, comprises exposing 525 the substrate to one or more first vapor deposition phases ("first deposition phases"), wherein at least one of the first deposition phases comprises an exposure to the Ti precursor and an exposure to the N precursor. Exposing 520 (FIG. 5A) the semiconductor substrate to one or more vapor deposition cycles, which can be ALD cycles, additionally comprises exposing 530 the substrate to one or more second vapor deposition phases ("second deposition phases"), wherein at least one of the second deposition phases comprises an exposure to the Si and/or Al precursor or a combination of an exposure to the Si and/or Al precursor and a further exposure to the N precursor. The one or more first deposition phases and the one or more second deposition phases can combine to form one cycle, which in turn can be repeated a plurality of times or cycles. Different cycles can have the same or different number of first and second deposition phases. The combination of exposing 525 the substrate to one or more first deposition phases and exposing 530 to one or more second deposition phases results in a diffusion barrier layer comprising a TiSiN and/or TiAlN layer or region. Each of exposing 525 the substrate to one or more first deposition phases and exposing 530 the substrate to one or more second deposition phases, in turn, can comprise one or more exposures to respective precursors, such as in pulses, as described below.

Still referring to FIGS. 5B-5D, in various embodiments, exposing 525 the substrate to each of the one or more first deposition phases comprises subjecting the substrate to one or more exposures to the Ti precursor and one or more exposures to the N precursor. Each exposure to the Ti precursor is such that the surface of the substrate on which the diffusion barrier is to be deposited is exposed to the Ti precursor, whereby the surface can become substantially or partly saturated with the Ti precursor. After exposing the substrate to the Ti precursor, excess or residual Ti precursor or its reaction products that do not remain adsorbed or chemisorbed on the surface of the substrate may be removed from the substrate surface, such as by having the process chamber pumped or purged out. Similarly, each exposure to the N precursor is such that the substrate on which the diffusion barrier is to be deposited is exposed to the N precursor, whereby the surface can become substantially or partly saturated with the N precursor. After exposing the substrate to the N precursor, excess or residual N precursor or its reaction products that do not remain adsorbed or chemisorbed or react with the surface of the substrate may be removed from the substrate surface, such as by having the process chamber pumped or purged out. Subjecting the substrate to one or more first deposition phases each comprising one or more exposures to the Ti precursor and one or more exposures to the N precursor may locally form one or more monolayers or a region formed substantially of TiN as-deposited.

In some embodiments, the exposure to the Ti precursor in a given first deposition phase may be performed a plurality of times in sequence. Similarly, the exposure to the N precursor in a given first deposition phase may be performed a plurality of times in sequence. Advantageously, under some circumstances, exposing the substrate to the Ti and/or N precursors more than once may result in a higher level of surface saturation, e.g., when substantial stearic hindrance effect exists, by exposing more reactive sites for the respective precursor adsorption or reaction.

Still referring to FIGS. 5B-5D, in various embodiments, exposing 530 the substrate to each of the one or more second deposition phases comprises subjecting the substrate to one or more exposures to the Si precursor or the Al precursor. Each exposure to the Si and/or Al precursor is such that the surface of the substrate on which the diffusion barrier is to be deposited is exposed to the Si and/or Al precursor, whereby the surface can become substantially or partly saturated with the Si and/or Al precursor. After exposing the substrate to the Si and/or Al precursor, excess or residual Si and/or Al precursor or its reaction products that do not remain adsorbed or chemisorbed on the surface of the substrate may be removed from the substrate surface, such as by having the process chamber pumped or purged out. Subjecting the substrate to one or more second deposition phases each comprising one or more exposures to the Si and/or Al precursor may locally form one or more monolayers or a region formed substantially of Si or Al, as-deposited.

In some embodiments, the exposure to the Si and/or Al precursor in a given second deposition phase may be performed a plurality of times in sequence. Advantageously, under some circumstances, exposing the substrate to the Si and/or Al precursor more than once may result in a higher level of surface saturation, e.g., when substantial stearic hindrance effect exists, by exposing more reactive sites for the respective precursor adsorption or reaction.

Still referring to FIGS. 5B-5D, in some embodiments, exposing 530 to the substrate to each of the one or more second deposition phases comprises subjecting the substrate to one or more exposures to the Si and/or Al precursor and further subjecting the substrate to one or more exposures to a N precursor, which can be the same as or different from the N precursor of the first deposition phases. Each exposure to the Si and/or Al precursor is such that the surface of the substrate on which the diffusion barrier is to be deposited is exposed to the Si and/or Al precursor, whereby the surface can become substantially or partly saturated with the Si and/or Al precursor. After exposing the substrate to the Si and/or Al precursor, excess or residual Si and/or Al precursor or its reaction products that do not remain adsorbed or chemisorbed on the surface of the substrate may be removed from the substrate surface, such as by having the process chamber pumped or purged out. Each exposure to the N precursor is such that the surface of the substrate on which the diffusion barrier is to be deposited is exposed to the N precursor, whereby the surface can become substantially or partly saturated with the N precursor. After the one or more further exposures to the N precursor, excess or residual N precursor or its reaction products that do not react with the surface of the substrate may be removed from the substrate surface, such as by having the process chamber pumped or purged out. Subjecting the substrate to one or more second deposition phases each comprising one or more exposures to the Si precursor and one or more exposures to the N precursor may locally form one or more monolayers or a region formed substantially of SiN or AN, as-deposited.

In some embodiments, the exposure to the Si precursor in a given second deposition phase may be performed a plurality of times in sequence. Similarly, the further exposure to the N precursor may be performed a plurality of times in sequence. Advantageously, under some circumstances, exposing the substrate to the Si and/or Al and/or N precursors as discussed herein more than once may result in a higher level of surface saturation, e.g., when substantial stearic hindrance effect exists, by exposing more reactive sites for the respective precursor adsorption.

It will be appreciated that, in various embodiments, number of cycles each including one or both of the first and second deposition phases, the frequency and number of repetition of the first deposition phases and the frequency and number of repetition of the second deposition phases, the frequency and the number of repetitions of the exposures of the substrate to the Ti precursor and the N precursor during the first deposition phases, and the frequency and the number of repetitions of the exposures of the substrate to the Si and/or Al precursor or the Si and/or Al precursor and the N precursor during the second deposition phases as described herein can be varied to obtain a desired thickness, stoichiometry and other properties described herein in the resulting diffusion barrier layer comprising TiSiN and/or TiAlN, based on various considerations including susceptibility to stearic hindrance effects of the precursors.

Still referring to FIGS. 5B-5D, depending on the circumstances or a film characteristic being sought, it may be advantageous to initiate the deposition of the diffusion barrier comprising TiSiN and/or TiAlN with one or the other of the exposures of the substrate to a first deposition phase or a second deposition phase. For example, the inventors have found that, exposing 530 the substrate to one or more second deposition phases (Si and/or Al precursor or N precursor) first, followed by exposing 525 the substrate to one or more first deposition phases (Ti precursor or N precursor), may be particularly advantageous in enhancing layer-by-layer growth mode of the diffusion barrier layer, thereby increasing conformality and reducing surface roughness, e.g., when the substrate surface comprises a nonmetallic surface, e.g., an insulating surface such as the sidewalls of a trench or a via formed in an interlayer dielectric (ILD) layer, or a semiconductor surface such as a Si diffusion region.

However, embodiments are not so limited and in other embodiments, it may be more advantageous to expose 525 the substrate to one or more first deposition phases (Ti precursor or N precursor) first, followed by exposing 530 the substrate to one or more second deposition phases (Si and/or Al precursor or N precursor), e.g., for reducing contact resistance while maintaining good conformality and surface roughness, e.g., when the substrate surface comprises a metallic surface (e.g., a W, Al, or Cu metal metallization).

Referring to FIG. 5D, under some circumstances, the sequence of first and second deposition phases may result in a thin film having regions or layers that are detectably rich in TiN and Si and/or Al or SiN and/or AN, depending on the sequence as described above. However, under other circumstances, despite the distinct sequence of exposures to first and second deposition phases, the resulting thin film may be substantially homogenous TiSiN and/or TiAlN thin films, as described in further infra.

According to various embodiments, non-limiting examples of the Ti precursor for forming the thin film, e.g., diffusion barrier layer or region, include titanium tetrachloride ($TiCl_4$), tetrakis(dimethylamino)titanium (TDMAT) or tetrakis(diethylamino)titanium (TDEAT).

According to various embodiments, non-limiting examples of the N precursor for forming the thin film, e.g., diffusion barrier layer or region, include ammonia ($NH_3$), hydrazine ($N_2H_4$) or monomethylhydrazine ($CH_3(NH)NH_2$, "MMH"). As noted above, different N precursors can be employed for the first and second deposition phases, and indeed different precursors can be used for different cycles of the same phase.

According to various embodiments, non-limiting examples of the inert gas for purging include nitrogen $N_2$ or a noble gas such as Ar.

According to some embodiments, the Si precursor for forming the diffusion barrier layer may be a hydride precursor. Examples of the hydride precursor include silane ($SiH_4$) and disilane ($Si_2H_6$). According to some other embodiments, the Si precursor for forming the diffusion barrier layer may be a chlorine-containing precursor, such as a silicon chloride or a chlorosilane. Examples include silicon tetrachloride ($SiCl_4$), monochlorosilane ($SiH_3Cl$, "MCS"), dichlorosilane ($SiH_2Cl_2$, "DCS"), trichlorosilane ($SiHCl_3$), hexachlorodisilane ($Si_2Cl_6$, "HCDS") and octachlorotrislane ($Si_3Cl_8$, "OCTS"). The inventors have found that the diffusion barrier layer comprising TiSiN may be desirably formed using a silicon and chlorine-containing Si precursor when a higher level of saturation of the surface by the precursor is desired under a wide variety of conditions due to reduced steric hindrance relative to organic silicon precursors.

According to some embodiments, the Al precursor for forming the diffusion barrier layer may be an organometallic precursor. Examples of the organometallic precursor include tri-methyl aluminum ("TMA"), tri-iso-butyl-aluminum and tris (dimethylamido) aluminum. According to some other embodiments, the Al precursor for forming the diffusion barrier layer may be chlorine-containing Al precursor, e.g. $AlCl_3$.

Without being bound to any theory, the inventors have found that these Si and Al precursors, when introduced as the first non-nitrogen precursor, can be particularly advantageous for promoting a layer-by-layer growth mode of the TiSiN layer or the TiAlN layer, compared to other Si or Al precursors. The layer-by-layer growth mode is achieved through improved wetting of the substrate surface by nuclei of the TiSiN layer or the TiAlN layer during early stages of growth, which may be characterized by a small contact angle between the nuclei and the substrate surface. As a result of the layer-by-layer growth mode, improved conformality and reduced surface roughness may be achieved, which can be particularly advantageous for forming the diffusion barrier by depositing in high aspect ratios with small dimensions. Further, without being bound to any theory, the chlorine-containing Si and/or Al precursors may enable more precise control of composition in the direction of growth by inhibiting or self-limiting adsorption.

For realizing various advantages disclosed herein, e.g., to serve as an effective diffusion barrier, the thin film comprising TiSiN and/or TiAlN can have a thickness that does not exceed about 25 nm, 20 nm, 15 nm, 10 nm, 7 nm, 4 nm, 2 nm, 1 nm or has a value in a range defined by any of these values or outside of these values, according to embodiments. These thickness can be substantially lower compared to TiN barriers having similar effectiveness as a diffusion barrier.

For realizing various advantages disclosed herein, e.g., to serve as a diffusion barrier, the thin film comprising TiSiN and/or TiAlN may be formed at a substrate temperature of 250° C.-300° C., 300° C.-400° C., 350° C.-400° C., 400° C.-450° C., 450° C.-500° C., 500° C.-550° C., 550° C.-600° C., 600° C.-650° C., or a temperature in a range defined by any of these values, for instance about 400° C., according to embodiments.

For realizing various advantages disclosed herein, e.g., to serve as an effective diffusion barrier, the exposure times or pulse durations of the various precursors are in the range of about 0.1-5 sec., 5-10 sec., 10-20 sec., 20-30 sec, 30-40 sec, 40-50 sec., 50-60 sec., or a duration in a range defined by any of these values or higher, according embodiments.

In summary, forming a thin film, e.g., a diffusion barrier, comprising TiSiN and/or TiAlN comprises exposing a substrate to one or more cycles each including one or more first deposition phases and/or one or more second deposition phases. Each of the first deposition phases in turn comprises one or more exposures to a Ti precursor alternating with one or more exposures to a N precursor. According to some embodiments, each of the second deposition phases in turn comprises one or more exposures to a Si or an Al precursor. According to some other embodiments, each of the second deposition phases comprises one or more exposures to a Si precursor and/or an Al precursor alternating with one or more exposures to a N precursor. The resulting diffusion barrier layer comprises a TiSiN layer or region or a TiAlN layer or region. According to various embodiments, the frequency and the number of exposures of the substrate to each of the Ti precursor, the N precursor and the Si and/or Al precursor, and the frequency and the number of exposures of the substrate to each of the cycles, first deposition phases and second deposition phases, as well as the order of the exposures, may be tailored to obtain a desired stoichiometry, thickness and degree of crystallinity, as described herein.

Deposition on Substrates Having High Surface Area and/or High Aspect Ratio Structures The inventors have discovered that, when a substrate has a relatively high surface area, e.g., arising from a relatively high area density of high aspect ratio structures, coating the exposed surface with a thin film using ALD process recipes developed based on characterization of thin films formed on a planar or unpatterned substrate or a substrate with relatively low surface area or low area density of high aspect ratio structures may yield thin films having different characteristics at different parts of the exposed surface. For example, the conformality or step coverage as described above may be significantly worse in high aspect ratio structures in substrates having a relatively high area density thereof. Other characteristics that may also be different at different parts of the exposed surface include film stoichiometry, surface roughness, electrical resistivity and film density, to name a few. Without being bound to any theory, one reason for the low uniformity of the characteristics may be the significantly increased exposed surface area of the substrate relative to a planar substrate. Because of the increased exposed surface area, different parts of the exposed surface may receive different magnitudes of the flux of precursors, such that different amounts of precursors may be adsorbed on different parts of the exposed surface. By way of a simplified example only, when a 300 mm semiconductor substrate has formed thereon hundreds of dies each having of the order of $1 \times 10^{10}$ or more transistors and each transistor has one or more vias having a diameter of 10-100 nm and an aspect ratio of 1 to 100, the surface area exposed to precursors during the deposition of the thin film can exceed the surface area of a corresponding unpatterned substrate 10, 100, 1000 or more. In addition, local deposition conditions at different parts of the exposed surface may be different. For example, local pressure inside a deep trench or a via may be different, e.g., lower, compared to regions outside the deep trench or the via. In addition, under vacuum conditions, because gas molecules undergo more collisions with sidewalls of the trench or the via, upper portions of the deep trench or the via may adsorb a higher amount of precursor molecules from being subjected to a higher flux.

According to various embodiments described herein, the inventors have discovered that the deposition methods described herein are particularly advantageous for forming thin films comprising TiSiN and/or TiAlN at different parts of the exposed surface with higher uniformity with respect to various physical characteristics including conformality, step coverage, film stoichiometry, surface roughness, electrical resistivity and film density, to name a few. Thus, the thin film comprising TiSiN and/or TiAlN formed according to deposition methods disclosed herein have higher uniformity at both local (e.g., within a trench or via) and global (e.g., within-wafer) levels with respect to one or more of these physical characteristics. Thus, the deposition methods according to embodiments are particularly advantageous for forming the thin film comprising TiSiN and/or TiAlN on a substrate that comprises a surface topography such that a ratio of a surface area of the semiconductor substrate exposed to the one or more vapor deposition cycles to a surface area of a corresponding unpatterened semiconductor substrate exceeds 2, 5, 10, 20, 50, 100, 200, 500, 1000 or has a ratio in a range defined by any of these values, or higher.

Alternatively or additionally, the deposition methods according to embodiments are additionally particularly advantageous for forming the thin film on a substrate that comprises high aspect ratio structures having an opening width less than 1 micron, 500 nm, 200 nm, 100 nm, 50 nm, 20 nm or a value in a range defined by any of these values, an aspect ratio exceeding 5, 10, 20, 50, 100, 200 or a value in a range defined by any of these values, and an area density such that the surface area is greater than a that of a planar substrate as described above. Substrates having such topography may be conformally coated with thin films comprising TiSiN and/or TiAlN according to embodiments with a step coverage as defined above that exceeds 50%, 60%, 70%, 80%, 90%, 95%, or has a value in a range defined by any of these values or higher. As discussed above, the inventors have found that process conditions for conformally coating a substrate having a relatively high area density of high aspect ratio structures may be optimized according to embodiments to achieve these results. The inventors have discovered that these results may be achieved by controlling, among other things, the reaction chamber pressure or partial pressures of precursors during exposures of the substrate, the deposition rate, the temperature or pressure of precursors being introduced into the reaction chamber, the flow rate of the precursors and the exposure time, to name a few.

The inventors have discovered that relatively higher total or partial pressures can lead to improvement in conformality and step coverage when coating a substrate having a relatively high area density of high aspect ratio structures, according to embodiments. Without being bound to any theory, such improvement may be associated with, among other things, lessening the effect of locally reduced partial pressure of precursors inside the high aspect ratio vias or trenches. Thus, according to embodiments, referring back to FIGS. 5B and 5C, total or partial pressures of any of the individual precursors during exposing 525 the substrate to one or more first deposition phases (Ti precursor and/or N precursor), and/or during exposing 530 the substrate to one or more second deposition phases (Si and/or Al precursor and/or N precursor), may be 1.0-3.0 torr, 3.0-5.0 torr, 5.0-7.0 torr, 7.0-9.0 torr, 9.0-11.0 torr, 11.0-13.0 torr, 13.0-15.0 torr, or a pressure in range defined by any of these values. In each of the exposures to the Ti precursor, the N precursor and/or the Si and/or Al precursor, the respective precursor can make up 1-2%, 2-5%, 5-10%, 10-20%, 20-50%, 50-100% of the total amount of gas molecules in the reaction chamber, or a percentage in a range defined by any of these values. The inventors have discovered that, under some circumstances, when the total or partial pressure is outside of these values, step coverage may start to degrade, among other things.

The relatively high total pressure or the partial pressures during exposing 525 the substrate to one or more first deposition phases (Ti precursor and/or N precursor), and/or during exposing 530 the substrate to one or more second deposition phases (Si and/or Al precursor and/or N precursor), in conjunction with the flow rates of the respective precursors and an inert gas, and the pumping power of the reaction chamber, are controlled such that the deposition rate is relatively high at 0.20-0.30 Å/deposition phase, 0.30-0.40 Å/deposition phase, 0.40-0.50 Å/deposition phase, 0.50-0.60 Å/deposition phase, 0.60-0.70 Å/deposition phase, 0.60-0.70 Å/deposition phase, 0.70-0.80 Å/deposition phase or a value in a range defined by any of these values, per first and/or second deposition phases, according to embodiments.

The inventors have discovered that, in part to enable relatively high throughput while delivering relatively high amounts of precursors to the reaction chamber for deposition at relatively high total or partial pressures, the flow rates of the precursors into the reaction chamber should be significantly higher than those used in process conditions for forming thin films on planar substrates and/or substrates with low (e.g., <1) aspect ratio structures. The high flow rates can in turn may be achieved by increasing one or both of the temperatures or the pressures of the precursors prior to introduction into the reaction chamber. For example, for precursors in liquid form under manufacturing conditions, the precursor bottles may be heated to temperatures higher than a room temperature, e.g., 30-60° C., 60-80° C., 80-100° C., 100-120° C., 120-150° C., or a temperature in a range defined by any of these values, to increase the vapor generation rate. The lower and upper bottle temperatures of these ranges may be determined in part based on the vapor pressure of the precursor and the decomposition temperature of the precursor, respectively. By way of example, $TiCl_4$ may be heated to about 60-80° C. On the other hand, for precursors in gas form under manufacturing conditions, the high flow rate may be achieved by increasing the gas line pressures to increase the delivery pressures to values that are much higher relative to gas line pressures used in forming thin films on relatively low surface area or planar substrates and/or substrates with low (e.g., <1) aspect ratio structures. It will be appreciated that the relatively high flow rate to achieve various advantages described herein can depend on, among other things, the pumping rate, exposure time, and volume of the reactor. To achieve flow rates adapted for depositing the thin film on substrates having a high surface area and/or high aspect ratio structures, the temperature and or pressure of the precursor, among other parameters, can be adjusted such that the flow rate of each of the Ti, N, Si and Al precursors can be, e.g., 100-1000 standard cubic centimeters per minute (sccm), 1000-2000 sccm, 2000-5000 sccm, 5000-10,000 sccm, 10,000-15,000 sccm, 15,000-20,000 sccm, or a value in a range defined by any of these values or higher. It will be appreciated that a suitable flow rate can depend, among other things, the volume of the reactor, and some of these flow rates may be suitable for single wafer reactors having a volume of about 1-2 liters.

Figure 6A:
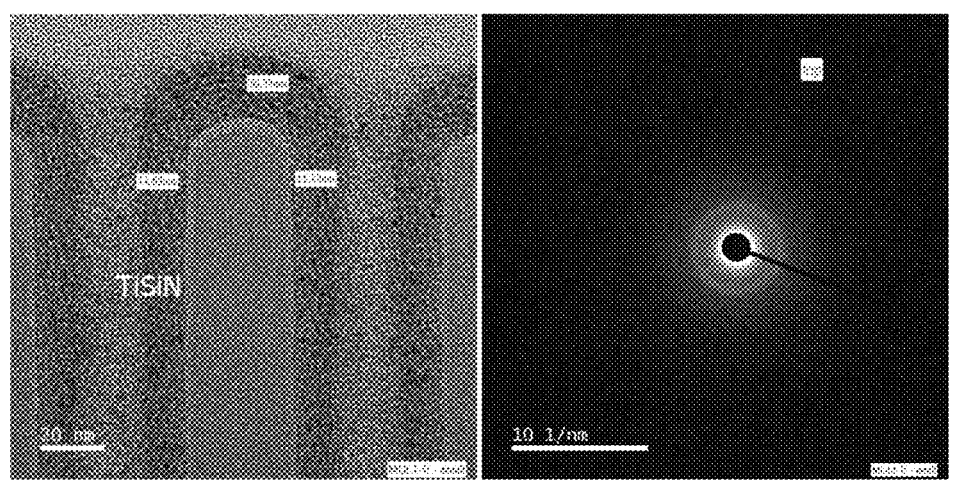
FIG. 6A shows a cross-sectional transmission electron micrograph and a corresponding selected area diffraction pattern obtained from a thin film comprising TiSiN lining an upper portion of a high aspect ratio via, according to embodiments.
Figure 6B:
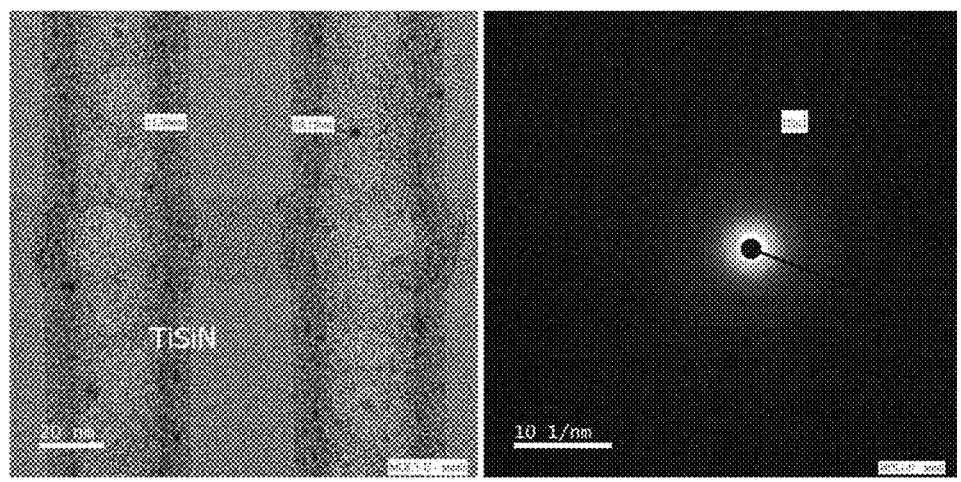
FIG. 6B shows a cross-sectional transmission electron micrograph and a corresponding selected area diffraction pattern obtained from a thin film comprising TiSiN lining a middle portion of the high aspect ratio via shown in FIG. 6A, according to embodiments.
Figure 6C:
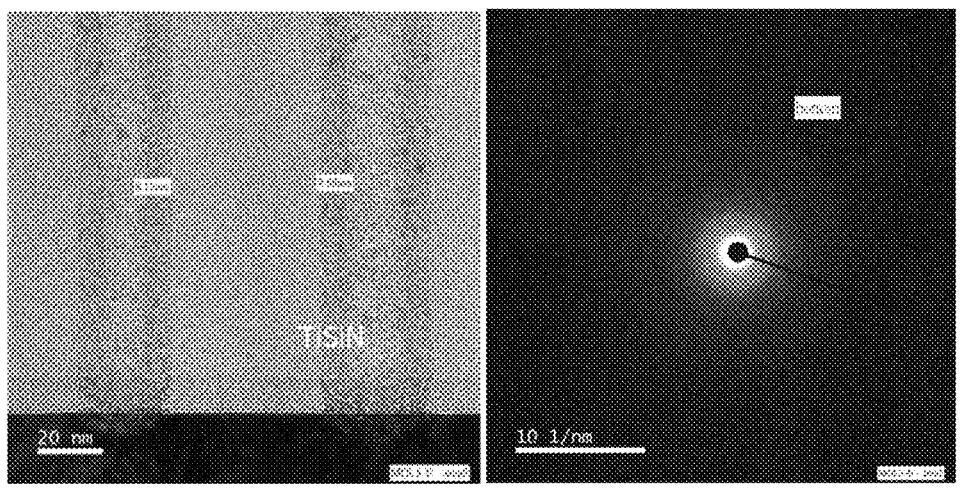
FIG. 6C shows a cross-sectional transmission electron micrograph and a corresponding selected area diffraction pattern obtained from a thin film comprising TiSiN lining a lower portion of the high aspect ratio via shown in FIGS. 6A and 6B, according to embodiments.

FIGS. 6A-6C illustrate experimental transmission electron microcopy (TEM) images of a conformal TiSiN film lining high aspect ratio vias formed according deposition techniques described herein. The high aspect ratio vias have a deposited silicon oxide surface. FIGS. 6A, 6B and 6C are TEM images taken at upper, middle and lower portions, respectively, of a thin TiSiN film formed in a via having an aspect ratio of about 40. In each of FIGS. 6A-6C, the left image is a bright field image of the respective portion of the high aspect ratio via and the right image shows a selective area diffraction (SAD) pattern obtained from the thin film formed on the respective portion of the high aspect ratio via using an electron beam having a spot size comparable to the thickness of the thin TiSiN film. Unlike polycrystalline TiN having a rough surface due to columnar growth as shown in FIG. 2, bright field TEM images of FIGS. 6A-6C show that the deposited TiSiN is much more smooth and conformal. The inventors have discovered that these and other improvements can be attributed in part to the presence of at least some amorphous phase of TiSiN, which can be present along with some nanocrystalline phase of TiSiN, as indicated by the SAD patterns. The thin TiSiN film is substantially amorphous and substantially conformal throughout the depth of the via with good step height coverage (~60%).

Control of Thin Film Morphology at Nanoscale

Advantageously, owing to the ability to control the adsorption of precursors at sub-monolayer level using various process parameters described herein, various embodiments of cyclic vapor deposition processes disclosed herein, which can be ALD processes, enable control and improvement of the film morphology and structure of thin films comprising TiSiN and/or TiAlN at the nanoscale. The controlled morphology and structure include the degree of crystallinity, homogeneity and surface roughness. In particular, the inventors have discovered that the degree of crystallinity and/or the homogeneity at the nanoscale can be advantageously controlled in thin films comprising TiSiN and/or TiAlN by controlling various parameters of the exposure cycles, as described herein.

According to various embodiments, when forming a thin film, e.g., a diffusion barrier layer, comprising TiSiN and/or TiAlN, the film morphology can be controlled using, in addition to various parameters described above, particular ratios of the number of exposures of the substrate to the first deposition phases (comprising a combination of exposures to the Ti precursor and the N precursor) to the number of exposures of the substrate to the second deposition phases (comprising an exposure to the Si and/or Al precursor or a combination of exposures to the Si and/or Al precursor and the N precursor). The ratio may be about 1:30-1:15, 1:15-1:6, 1:6-1:3, 1:3-1:2, 1:2-2:3, 2:3-5:6, 5:6-1:1, 1:1-6:5, 6:5-3:2, 3:2-2:1, 2:1-3:1, 3:1-6:1, 6:1-15:1, 15:1-30:1, or a ratio in a range defined by any of these values. For instance, the ratio may be one of 2:3, 3:2, 5:4, 7:3, 7:5, 7:1, 10:1 and 15:1. Alternatively, exposures to the Ti precursor and the Si and/or Al precursor can have these ratios. Under the combination of process conditions described herein for forming the diffusion barrier comprising TiSiN and/or TiAlN, the ratio of the exposures to the first deposition phases to the exposures to the second deposition phases is such that Si or Al is present in the diffusion barrier at an average concentration exceeding about 3%, 10%, 20%, 30%, 40%, 50%, 60%, 70%, 80%, 90%, or a value in a range defined by any of these values, on the basis of the total number of atoms in the diffusion barrier.

The inventors have discovered that, by controlling the ratio of the number of exposures of the substrate to the first deposition phases (or the Ti precursor) to the number of exposures of the substrate to the second deposition phases (or the Si or Al precursor) the degree of crystallinity of the resulting thin film comprising TiSiN and/or TiAlN can be continuously tuned, as illustrated in FIGS. 7A-7C. FIGS. 7A-7C show selected area diffraction (SAD) patterns obtained from conformal thin films comprising TiSiN deposited on sidewalls of a high aspect ratio via similar to that illustrated in FIGS. 6A-6C, with varying degrees of crystallinity. FIGS. 7A-7C show, respectively, a SAD pattern of a TiSiN thin film that is substantially fully amorphous, a SAD pattern of a TiSiN thin film that is partly amorphous and partly crystalline or nanocrystalline and a SAD pattern of a TiSiN thin film that is substantially polycrystalline or nanocrystalline. It will be appreciated that the presence of nanocrystalline or polycrystalline domains and the qualitative degree of crystallinity can be determined from the positions and the relative sharpness of the diffraction spots and/or rings that can be indexed to (111), (200) and (220) crystal planes of crystalline TiSiN as indicated in FIG. 7C. For example, an SAD pattern having predominantly diffuse rings can be associated with substantially amorphous TiSiN, while an SAD pattern having predominantly spots can be associated with substantially polycrystalline TiSiN having domain sizes comparable to the selected area used to obtain the SAD pattern. An SAD pattern having nanocrystalline and amorphous phases of TiSiN can have a mix of both diffuse rings and spots. The inventors have discovered that, among other things, an increasing fraction of amorphous phase can be attributed to increasing smoothness, conformality and step coverage of the TiSiN thin film.

Figure 8:
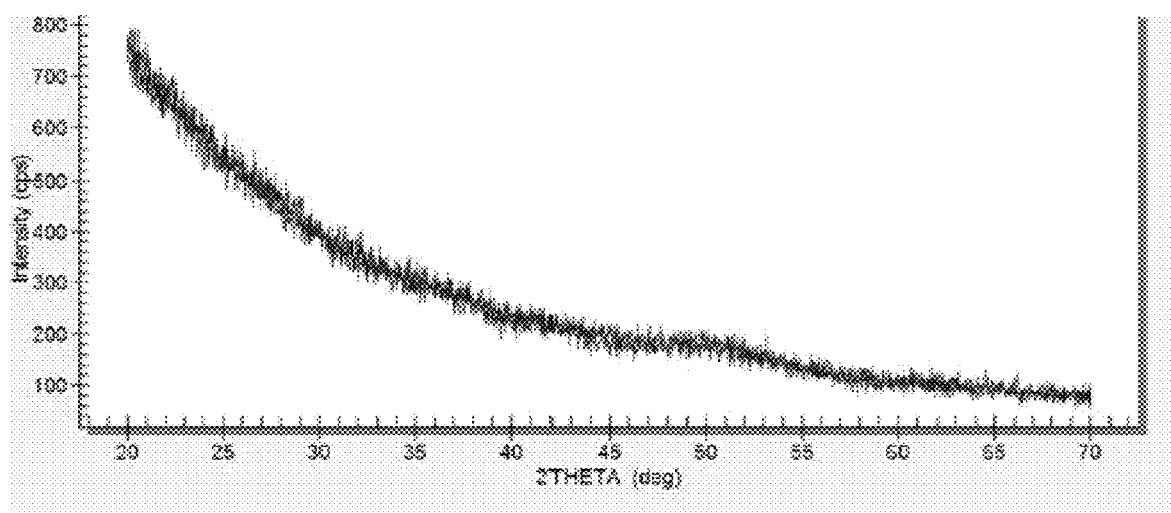
FIG. 8 shows a grazing incidence X-ray diffraction spectrum obtained from a substantially amorphous thin film comprising TiSiN, according to embodiments.

FIG. 8 is a grazing incidence X-ray diffraction pattern of a blanket TiSiN layer formed on a Si substrate that is substantially fully amorphous, according to embodiments. The measured TiSiN layer is similar to the TiSiN layer imaged for the SAD patterns in FIG. 7A and FIGS. 6A-6C. The lack of distinct crystallographic peaks attributable to a crystalline phase of TiSiN layer indicates the substantially fully amorphous nature of the TiSiN layer.

Figure 9:
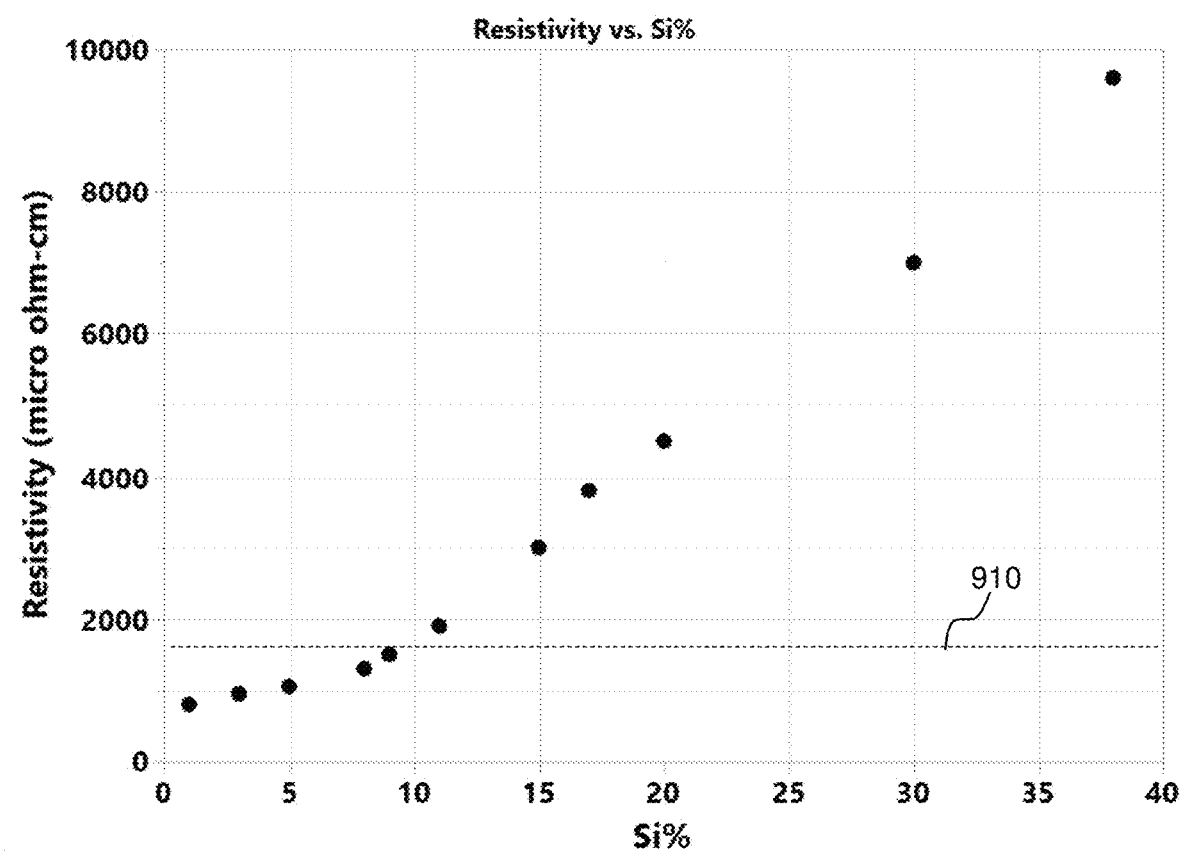
FIG. 9 is a graph of experimentally measured resistivity as a function of silicon content for a thin film comprising TiSiN, according to embodiments.

As described herein, the relative crystallinity of the thin film comprising TiSiN and/or TiAlN can be tuned to optimize various material characteristics, e.g., diffusion barrier characteristics. Under some circumstances, a lower degree of crystallinity may be preferred, e.g., to reduce grain boundaries. Reduced grain boundaries can suppress diffusion of certain elements through the thin film and improve smoothness. However, under other circumstances, a higher degree of crystallinity may be preferred, e.g., to reduce the electrical resistivity of the thin film. FIG. 9 is a graph of experimentally measured resistivity as a function of silicon content for thin films comprising TiSiN, according to embodiments. The graph illustrates that the resistivity of the TiSiN thin film can be tuned over a wide range of values by tuning the relative Si content (atomic %) in the thin film, which can in turn be tuned by tuning the number of exposures to a Si precursor in the cyclic vapor deposition or ALD cycle. The inventors have found that, while the resistivity of the TiSiN layer increases relatively slowly as a function of Si content at relatively low Si content, the resistivity increases relatively fast as a function of Si content at relatively high Si content. The inventors have found that a relatively fast increase in the resistivity as a function of Si content generally coincides with an onset 910 of the emergence of an amorphous phase of TiSiN, as verified experimentally by transmission electron microscopy as described above. It will be appreciated that the onset 910 and the electrical resistivity can depend on, among other things, the deposition temperature and the precursors used. As discussed above, to form at least partly amorphous TiSiN layer, higher than about 10% of Si may be desirable. While the resistivity may increase as a result, the overall thickness may be reduced relative to fully crystalline layers such as TiN layers.

Thus, in circumstances where it is advantageous to have a thin film having a relatively high diffusion barrier capability and/or relatively low surface roughness, the composition of the electrode layer can advantageously be tuned such that the thin film comprising TiSiN and/or TiAlN is at least partially amorphous. In these implementations, the thin film may be substantially entirely amorphous or comprise nanocrystalline regions surrounded by an amorphous matrix. For example, the electrode may include one or more of TiSi/TiAl, TiN, and TiAlN/TiSiN nanocrystals in an amorphous matrix including Ti, Al/Si and N. In the illustrated implementation, the onset 910 at about 1600 μΩ-cm corresponds to an average atomic concentration of Si of about 10%. However, in other implementations, the onset can correspond to an average Si concentration of about 10%, 15%, 20% or 25%, or a value in a range defined by any of these values, depending on the deposition conditions and the precursors used. Alternatively, the onset 910 corresponds to a ratio of the number of exposures of substrate to the one or more first deposition phases (each comprising a combination of exposures to the Ti precursor and the N precursor, without exposures to Si and/or Al precursors) to the number of exposures of the substrate to the one or more second deposition phases (each comprising an exposure to the Si and/or Al precursor or a combination of exposures to the Si and/or Al precursor and the N precursor) of 1:1-2:1, 2:1-3:1, 3:1-6:1, 6:1-15:1, 15:1-30:1, or a ratio in a range defined by any of these values. Alternatively, these ratios can represent the ratio of the number of exposures to the Ti precursor to the number of exposures to the N precursor.

The composition of thin films comprising TiSiN and/or TiAlN can be tuned to have an electrical resistivity of <1000 μΩ-cm, 1000-2000 μΩ-cm, 2000-3000 μΩ-cm, 3000-4000 μΩ-cm, 4000-5000 μΩ-cm, 5000-6000 μΩ-cm, 6000-7000 μΩ-cm, 7000-8000 μΩ-cm, 8000-9000 μΩ-cm, 9000-10000 μΩ-cm, or greater than 10000 μΩ-cm, or a value in a range defined by any of these values.

Figure 10A:
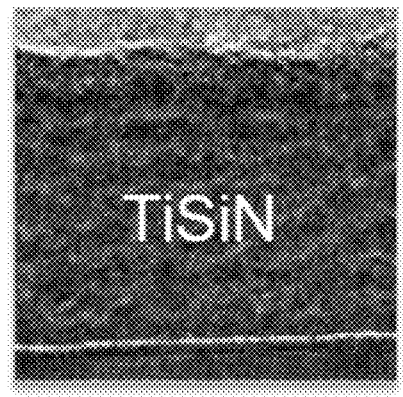
FIG. 10A is a cross-sectional transmission electron micrograph obtained from a substantially homogenous thin film comprising TiSiN, according to embodiments.
Figure 10B:
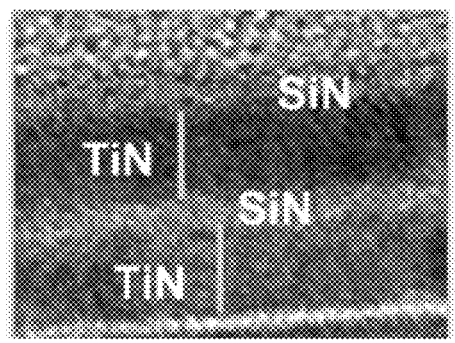
FIG. 10B is a cross-sectional transmission electron micrograph obtained from a nanolaminate thin film comprising regions or layers of TiN alternating with regions or layers of SiN, according to embodiments.

In addition to the degree of crystallinity, the inventors have found that a degree of homogeneity at the nanoscale can also be controlled by controlling the number of exposures to the first deposition phase and/or the number of exposures to the second deposition phase. Under some circumstances, the sequence of first and second deposition phases may be controlled to form a thin film having regions or layers that are rich in TiN and Si and/or Al or SiN and/or AN, e.g., a nanolaminate comprising TiN-rich regions or layers alternating with Si-rich and/or Al-rich regions or layers or SiN/AlN-rich regions or layers. Under some other circumstances, the despite the distinct sequence if exposures to first and second deposition phases, the resulting thin film may be substantially homogenous TiSiN and/or TiAlN thin films, as described in further detail below. Example implementations are illustrated with respect to FIGS. 10A and 10B. FIG. 10A illustrates a TEM image of a TiSiN layer that is substantially homogeneous, whereas FIG. 10B illustrates a TEM image of a TiSiN layer that is in the form of a nanolaminate comprising TiN-rich regions or layers alternating with SiN-rich regions or layers.

According to various embodiments, when forming a thin film, e.g., a diffusion barrier layer, comprising TiSiN and/or TiAlN, to form a substantially homogenous layer, as shown in FIG. 10A, the number of back-to-back performances of the first deposition phases and/or the second deposition phases may be less than about 50, 30, 25, 20, 15, 10, 5, or value in a range defined by any of these values, when the thin film is deposited at temperatures disclosed above. The thin film may comprise a nanolaminate structure when the number of back-to-back performances of the first deposition phases and/or the second deposition phases exceeds these values. It will be appreciated that the number of back-to-back performances the first and/or second deposition phases for forming a substantially homogenous or a nanolaminate structure may depend on various factors, including temperature, pressure and the precursors used. For example, at a relatively high temperature, higher diffusive mixing of atoms may favor a homogenous composition, whereas at relatively low temperature, lower diffusive mixing of atoms may favor a nanolaminate formation.

The inventors have found that, advantageously, when the thin film comprising TiSiN and/or TiAlN is formed according to embodiments disclosed herein, the surface roughness can also be reduced compared to other diffusion barrier materials, e.g., TiN, or TiSiN formed using other techniques, e.g., CVD or PVD. The reduced surface roughness is particularly advantageous compared to other materials or techniques when the surface on which the diffusion barrier is deposited comprises a nonmetallic surface, e.g., a dielectric surface and/or a semiconductor surface exposed by an opening such as a via or a trench. As deposited, the diffusion barrier having the above-indicated thicknesses can have a root-mean square (RMS) surface roughness of 0.5%, 1%, 1.5%, 2%, 2.5%, 3%, 3.5%, 4%, 4.5% and 5%, on the basis of an average thickness of the diffusion barrier, or a value in a range defined by any of these values or a lower value. Alternatively, as-deposited, the diffusion barrier having the above-indicated thicknesses can have a root-mean square (RMS) surface roughness value that is less than 0.5 nm, 0.4 nm, 0.3 nm, 0.2 nm, 0.1 nm, or a value in a range defined by any of these values or a lower value. The reduced RMS roughness can in turn improve the conformality of the diffusion barrier layers.

Applications

The thin films comprising TiSiN or TiSiN formed using various process parameters according to various embodiments disclosed herein can be used in a variety of applications, particularly where the substrate comprises a topography having a relatively high surface area, relatively high aspect ratio structures and/or a non-metal surface that can benefit from various advantageous characteristics disclosed herein. Example applications include deposition to line a via, a hole, a trench, a cavity or a similar structure having an aspect ratio, e.g., a ratio defined as a depth divided by a top width, that exceeds 1, 2, 5, 10, 20, 50, 100, 200 or a value in a range defined by any of these values.

Figure 11:
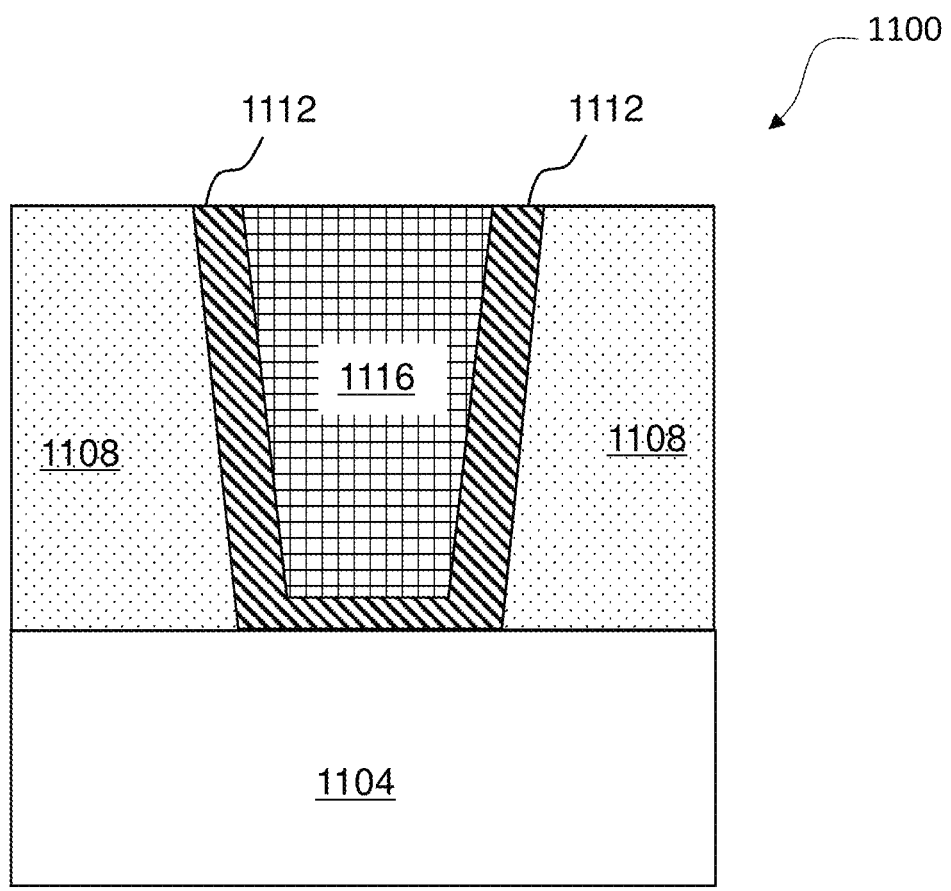
FIG. 11 schematically illustrates a cross-sectional view of a portion of a semiconductor device comprising a contact or metal line formed by filling an opening lined with a thin film comprising TiSiN or TiAlN with a metal, according to embodiments.

FIG. 11 illustrates one example application in the context of forming a diffusion barrier for a contact structure, e.g., a source or drain contact, formed on an active semiconductor substrate region that may be heavily doped. The portion of a semiconductor device 1100 is illustrated, which includes a material 1104 on which a dielectric layer 1108, e.g., an interlayer dielectric (ILD) layer comprising a dielectric material such as a silicon oxide or silicon nitride is formed. To form contacts to various regions of the substrate 1104, including various doped regions, e.g., source and drain regions, a via or a trench may be formed through the dielectric layer 1108. The via or the trench may expose various non-metal surfaces, e.g., an exposed bottom surface comprising a substrate surface, e.g., a silicon substrate surface, as well as dielectric sidewalls of the vias. Thereafter, the bottom and side surfaces of the via can be conformally coated with a thin film comprising TiSiN and/or TiAlN according to various embodiments described herein, in a similar manner as shown in FIGS. 6A-6C. Thereafter, the lined via may be filled with a more conductive material, particularly a metal or metal alloy, e.g., W, Al or Cu, to form a contact plug 1116. For example, the via may be filled with tungsten by CVD using, e.g., $WF_6$.

The barrier layer 1112 formed according to embodiments can be advantageous for various reasons described above. In addition, due to the conformal nature of the barrier layer 1112, the propensity for a pinching off during the subsequent metal fill process may be substantially reduced. In addition, as described above, the barrier layer 1112 can provide effective hindrance of material transport thereacross, e.g., dopant (B, P) out-diffusion from the substrate 1104, as well as in-diffusion of reactants, etchants and metals (e.g., F, Cl, W or Cu) from the contact plug formation process. The barrier effect may be enhanced by reduced surface roughness, increased step coverage, partly amorphous morphology (which can be partly nanocrystalline) and/or homogeneous/nanolaminate morphology. These advantageous effects may be achieved at lower thicknesses relative to a TiN thin film. Furthermore, as described above, a layer-by-layer growth mode may reduce the overall contact resistance of the barrier layer 1112.

Other applications of thin films comprising TiSiN and/or TiAlN formed according various embodiments disclosed herein include various conductive structures formed in recessed substrates (e.g., buried electrodes or lines), electrodes (e.g., DRAM capacitor electrodes or gate electrodes), metallization barriers for higher metal levels (e.g., barriers in vias/trenches for Cu contacts/lines), high aspect ratio vertical rod electrodes or vias for three-dimensional memory and through-silicon vias (TSVs), to name a few.

Although the present invention has been described herein with reference to the specific embodiments, these embodiments do not serve to limit the invention and are set forth for illustrative purposes. It will be apparent to those skilled in the art that modifications and improvements can be made without departing from the spirit and scope of the invention.

Such simple modifications and improvements of the various embodiments disclosed herein are within the scope of the disclosed technology, and the specific scope of the disclosed technology will be additionally defined by the appended claims.

In the foregoing, it will be appreciated that any feature of any one of the embodiments can be combined or substituted with any other feature of any other one of the embodiments.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while features are presented in a given arrangement, alternative embodiments may perform similar functionalities with different components and/or sensor topologies, and some features may be deleted, moved, added, subdivided, combined, and/or modified. Each of these features may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A method of forming a thin film, the method comprising:
   forming a thin film comprising one or both of TiSiN and TiAlN by exposing a semiconductor substrate to a plurality of vapor deposition cycles at a pressure in a reaction chamber greater than 5 torr, wherein the vapor deposition cycles comprise exposures to a titanium (Ti) precursor, exposures to a nitrogen (N) precursor and exposures to one or both of a silicon (Si) precursor and an aluminum (Al) precursor,
   wherein forming the thin film comprises exposing the semiconductor substrate to the plurality of vapor deposition cycles without an aid of a plasma.

2. The method of claim 1, wherein the pressure in the reaction chamber is less than 10 torr.

3. The method of claim 1, wherein, prior to forming the thin film, the semiconductor substrate is patterned to have a surface topography such that a ratio of an entire front surface area of the semiconductor substrate to an entire front surface area of an unpatterned flat semiconductor substrate having the same substrate diameter as the semiconductor substrate exceeds 2.

4. The method of claim 3, wherein the semiconductor substrate comprises a plurality of trenches or vias formed thereon, wherein the trenches or vias comprise a dielectric sidewall surface and an aspect ratio exceeding 5.

5. The method of claim 1, wherein exposing the semiconductor substrate to the plurality of vapor deposition cycles comprises:
   exposing the semiconductor substrate to a plurality of first deposition phases, wherein the first deposition phases comprise the exposure to the Ti precursor and the exposure to the N precursor; and
   exposing the semiconductor substrate to a plurality of second deposition phases, wherein the second deposition phases comprise the exposure to one or both of the Si precursor and the Al precursor.

6. The method of claim 5, wherein the second deposition phases further comprise a further exposure to the N precursor.

7. The method of claim 5, wherein a ratio of a number of the first deposition phases to a number of the second deposition phases is such that the thin film is at least partially amorphous.

8. The method of claim 7, wherein the ratio of the number of the first deposition phases to the number of the second deposition phases is equal to or less than 15:1.

9. The method of claim 5, wherein a number of the first deposition phases and a number of the second deposition phases are such that the thin film is substantially homogenous in a layer depth direction.

10. The method of claim 9, wherein the number of the first deposition phases and the number of the second deposition phases do not exceed about 50 cycles.

11. The method of claim 1, wherein the thin film comprises TiSiN, and wherein the Si precursor is a compound selected from the group consisting of $SiH_4$, $Si_2H_6$, $SiH_2Cl_2$, $SiH_3Cl$, $Si_2Cl_6$ and $Si_3Cl_8$.

12. The method of claim 1, wherein the thin film comprises TiAlN, and wherein the Al precursor is a compound selected from the group consisting of tri-methyl aluminum, tri-iso-butyl-aluminum and tris (dimethylamido) aluminum.

13. The method of claim 1, wherein exposing the semiconductor substrate to the vapor deposition cycles is performed at a substrate temperature of 450° C. to 650° C.

14. A method of forming a diffusion barrier, comprising:
   providing a semiconductor substrate comprising a plurality of openings formed thereon; and
   lining surfaces of the openings with a diffusion barrier layer comprising one or both of TiSiN and TiAlN by a thermal cyclic vapor deposition process without an aid of a plasma, comprising exposing the semiconductor substrate to a plurality of vapor deposition cycles at a pressure in a reaction chamber greater than 5 torr, wherein the vapor deposition cycles comprise exposures to a titanium (Ti) precursor, exposures to a nitrogen (N) precursor and exposures to one or both of a silicon (Si) precursor and an aluminum (Al) precursor.

15. The method of claim 14, wherein each of the openings comprises a dielectric sidewall and an aspect ratio exceeding 5.

16. The method of claim 14, wherein lining the surfaces of the openings comprises conformally lining the surfaces such that a ratio of thicknesses of the diffusion barrier layer formed on lower 25% of a height of the openings and upper 25% of the height of the openings exceeds 0.6.

17. The method of claim 14, wherein exposing the semiconductor substrate to the vapor deposition cycles comprises:
   exposing the semiconductor substrate to a plurality of first deposition phases, wherein the first deposition phases comprise the exposures to the Ti precursor and the exposures to the N precursor; and
   exposing the semiconductor substrate to a plurality of second deposition phases, wherein the second deposition phases comprise the exposures to one or both of the Si precursor and the Al precursor.

18. The method of claim 17, wherein the second deposition phases further comprise a further exposure to the N precursor.

19. The method of claim 17, wherein a ratio of a number of the first deposition phases to a number of the second deposition phases is such that the diffusion barrier is at least partially amorphous.

* * * * *

UNITED STATES PATENT AND TRADEMARK OFFICE
CERTIFICATE OF CORRECTION

| | | |
|---|---|---|
| PATENT NO. | : 12,165,918 B2 | Page 1 of 2 |
| APPLICATION NO. | : 17/837518 | |
| DATED | : December 10, 2024 | |
| INVENTOR(S) | : Niloy Mukherjee et al. | |

It is certified that error appears in the above-identified patent and that said Letters Patent is hereby corrected as shown below:

In the Drawings

On Sheet 5 of 14, Fig. 5A, Ref No. 510, Line 6, delete "corresponding unpatterned semiconductor" and insert --corresponding unpatterned semiconductor--.

In the Specification

In Column 2, Line 3, delete "plurality trenches" and insert --plurality of trenches--.

In Column 4, Line 51, delete "having relative high" and insert --having relatively high--.

In Column 8, Lines 41-42, delete "according embodiments." and insert --according to embodiments.--.

In Column 8, Line 50, delete "plurality openings," and insert --plurality of openings,--.

In Column 10, Line 25, delete "may be in" and insert --may in--.

In Column 12, Line 38, delete "or AN, as-deposited." and insert --or AlN, as-deposited.--.

In Column 13, Line 29, delete "and/or AN, depending" and insert --and/or AlN, depending--.

In Column 13, Line 60, delete "and octachlorotrislane (Si$_3$Cl$_8$," and insert --and octachlorotrisilane (Si$_3$Cl$_8$,--.

In Column 14, Line 48, delete "according embodiments." and insert --according to embodiments.--.

In Column 15, Line 63, delete "corresponding unpatterened semiconductor" and insert --corresponding unpatterned semiconductor--.

Signed and Sealed this
Twenty-fifth Day of March, 2025

Coke Morgan Stewart
*Acting Director of the United States Patent and Trademark Office*

CERTIFICATE OF CORRECTION (continued)
U.S. Pat. No. 12,165,918 B2

In Column 17, Lines 28-29, delete "temperature and or pressure" and insert --temperature and/or pressure--.

In Column 17, Line 40, delete "electron microcopy (TEM)" and insert --electron microscopy (TEM)--.

In Column 17, Line 41, delete "according deposition" and insert --according to deposition--.

In Column 20, Line 24, delete "and/or AN, e.g.," and insert --and/or AlN, e.g.,--.

In Column 22, Line 2, delete "according various" and insert --according to various--.

In the Claims

In Column 23, Claim 1, Line 17, delete "and TiAlN by" and insert --and TiAlN by--.

In Column 24, Claim 12, Line 12, delete "comprises TiAlN, and" and insert --comprises TiAlN, and--.

In Column 24, Claim 14, Line 23, delete "and TiAlN by" and insert --and TiAlN by--.